United States Patent
Hwang

[11] Patent Number: 6,026,764
[45] Date of Patent: Feb. 22, 2000

[54] APPARATUS FOR LOW PRESSURE CHEMICAL VAPOR DEPOSITION

[76] Inventor: Chul-Ju Hwang, 87, Seohyun-Dong, Hanshin Apt. 121-401, Bundang-Ku, Sungnam-Shi, Kyungki-Do, Rep. of Korea

[21] Appl. No.: 09/348,236

[22] Filed: Jul. 6, 1999

Related U.S. Application Data

[62] Division of application No. 08/571,404, Dec. 13, 1995, Pat. No. 5,928,427.

[30] Foreign Application Priority Data

| Dec. 16, 1994 | [KR] | Rep. of Korea | 34617/1994 |
| Jan. 21, 1995 | [KR] | Rep. of Korea | 1029/1995 |
| Apr. 1, 1995 | [KR] | Rep. of Korea | 6520/1995 |
| Aug. 1, 1995 | [KR] | Rep. of Korea | 23668/1995 |

[51] Int. Cl.[7] .................................................. C23C 16/00
[52] U.S. Cl. ...................... 118/723 E; 118/715; 118/725; 118/729
[58] Field of Search ............................... 118/715, 723 E, 118/725, 729

[56] References Cited

U.S. PATENT DOCUMENTS

| 4,142,004 | 2/1979 | Hauser et al. . |
| 4,493,977 | 1/1985 | Arai et al. . |
| 4,504,730 | 3/1985 | Shimizu . |
| 4,748,135 | 5/1988 | Frijlink . |
| 5,160,543 | 11/1992 | Ishihara et al. . |
| 5,164,012 | 11/1992 | Hattori . |
| 5,254,171 | 10/1993 | Hayakawa et al. . |
| 5,329,095 | 7/1994 | Okase . |
| 5,370,371 | 12/1994 | Miyagi et al. . |
| 5,536,918 | 7/1996 | Ohkase et al. . |
| 5,683,518 | 11/1997 | Moore et al. . |

FOREIGN PATENT DOCUMENTS

| 0382988 | 8/1990 | European Pat. Off. . |
| 0478908 | 4/1992 | European Pat. Off. . |
| 59-112615 | 6/1984 | Japan . |
| 61-026218 | 2/1986 | Japan . |
| 2185978 | 7/1990 | Japan . |
| 2256085 | 3/1992 | United Kingdom . |

*Primary Examiner*—Richard Bueker
*Attorney, Agent, or Firm*—D. Peter Hochberg

[57] ABSTRACT

An improved apparatus for a lower pressure chemical vapor deposition capable of achieving various kinds of thin films having a uniform thickness, preventing parts breakage, achieving automation of the system, and combining the use of a low pressure chemical vapor deposition apparatus and a plasma low pressure chemical vapor deposition apparatus, which includes a deposition base; a reactor disposed on the deposition base and having a reaction region formed therein; a substrate lifted and lowered in the reactor and on which a wafer is placed; a chemical source gas introducer for introducing a chemical source gas into the reactor; a substrate heating member disposed in the substrate for heating the wafer; and a reactor heating member for heating the reactor.

6 Claims, 19 Drawing Sheets

APPARATUS FOR LOW PRESSURE CHEMICAL VAPOR DEPOSITION

CROSS REFERENCE TO RELATED APPLICATION

This application is a divisional of U.S. patent application Ser. No. 08/571,404 filed on Dec. 13, 1995 now U.S. Pat. No. 5,928,427.

BACKGROUND OF THE INVENTION

1. Field of the Invention

The present invention relates to an apparatus for a low pressure chemical vapor deposition, and particularly to an improved apparatus for a low pressure chemical vapor deposition capable of achieving a fabrication of various kinds of thin films having a uniform thickness, preventing breakages of the parts, achieving automation of the system, and combining the use of a low pressure chemical vapor deposition apparatus and a plasma low pressure chemical vapor deposition apparatus.

2. Description of the Conventional Art

As well known to those skilled in the art, the low pressure chemical vapor deposition (hereinafter called an "LPCVD") technique has been widely used so as to deposit nitride layers, oxide layers, silicon layers, and the like on a wafer having insulating, dielectric or conductive characteristics.

The deposition apparatus adopted in the LPCVD is directed to depositing a compound-made thin film on a wafer by reacting a chemical source gas in a reactor under a low pressure. This apparatus includes a single wafer input low pressure chemical vapor deposition device for depositing while loading wafer one by one and a vertical type low pressure chemical vapor deposition device for depositing in a state that a plurality of wafers are loaded. In addition, the single wafer input low pressure chemical vapor deposition apparatus has advantages in that it is easy to make the system automated and does not require wide foot point.

Hereinafter, only the single wafer input low pressure chemical vapor deposition apparatus of the conventional low pressure chemical vapor deposition apparatuses will now be explained.

FIG. 1 shows a conventional single wafer input low pressure chemical vapor deposition apparatus, which includes a deposition base 11 having a wafer inlet 11a and an outlet 11b for discharging reaction substances and opening/closed by an opening/closing plate 11c, a reactor 12 disposed above the deposition base 11 for forming a reaction space "S", a chemical source gas introducer 13 disposed on the upper portion of the reactor 12, and a substrate 14 which is lifted/lowered within the reaction space "S" by a lifting/lowering ram 15 passing through the opening/closing plate 11c.

The above-mentioned conventional single wafer input low pressure chemical vapor deposition apparatus is directed to placing a wafer "W" on the substrate 14 by introducing the wafer "W" through the wafer inlet 11a in a state that the substrate 14 is lowered down to a loading/unloading position lower than the wafer inlet 11a, and lifting the substrate 14 using the lifting/lowering ram 15, driving a substrate heating member 16 disposed at the substrate 14, and introducing chemical source gas into the reactor 12 through a chemical source gas introducer 13, whereby the chemical source gas is deposited on the wafer "W" so as to form a compound thin film.

However, the conventional single wafer input low pressure chemical vapor deposition apparatus has disadvantages in that when heat is applied to the substrate 14 having a wafer "W", since the heat is not applied to the reactor 12 and its periphery, the thermal effect is deteriorated. Due to the above-mentioned thermal effect, the pin hole is caused at the thin film, and tie step coverage is decreased.

In addition, because the conventional single wafer input low pressure chemical vapor deposition apparatus provides the chemical source gas introducer 13, connected to a lower portion of the introduction tube 13a passing through the upper surface of the reactor 12, and a shower head 13b having a plurality of shower apertures so as to simply eject chemical source gas, so that a desired compound mixing cannot be achieved, whereby non-uniform layer can be deposited on the entire wafer surface.

Moreover, in order to overcome the above-mentioned problems, the plasma enhanced low pressure chemical vapor deposition apparatus, which is characterized to reacting the chemical source gas by generating plasma by connecting a plasma generator to the substrate and the electrode of the reactor, was introduced.

As shown in FIG. 2, the conventional plasma low pressure chemical vapor deposition apparatus includes a deposition base 21 having an inlet 21a formed at one side thereof and an outlet 21b formed at the other side thereof, wherein the lower portion thereof is opened/closed by an opening/closing plate 21c, a reactor 22 disposed at an upper portion of the deposition base 21, a chemical source gas introducer 23 disposed at the upper surface of the reactor 22, a substrate 24 on which a wafer "W", which can be lifted/lowered within the reactor 22 by a lifting/lowering ram 25 through the opening/closing plate 21c, is mounted, a substrate heating member 26 disposed at the substrate 24, and a plasma generator 27 disposed at the reactor 22 and the substrate 24 and connected to electrodes 27a and 27b.

The above-mentioned conventional plasma low pressure chemical vapor deposition apparatus is directed to depositing a compound thin film on a wafer "W" by lowering the lifting/lowering ram 25 through the opening/closing plate 21c and the substrate 24 down to a loading/unloading position lower than the inlet 21a, by mounting the wafer "W" on the substrate 24 through the inlet 21a, and by generating plasma in the reactor 22 by driving the plasma generator 27 connected to the electrodes 27a and 27b mounted on an upper portion of the reactor 22 and the substrate while introducing the chemical source gas into the reactor 22 through the chemical source gas introducer 23 and while heating the substrate and the wafer "W" by driving the substrate heating member 26 after lifting the substrate 24 with the wafer "W" up to the deposition position.

The above-mentioned plasma low pressure chemical vapor deposition apparatus has advantages in that it can minimize a characteristic variation of a device due to a deposition temperature by maintaining the process temperature at a low temperature by ionizing the chemical source gas by generating plasma. However, it has disadvantages in that the heat effect is deteriorated because the chemical source gas is introduced into a reaction space "S" in a state that the chemical source gas is not substantially heated since only the substrate 24, on which the wafer "W" is mounted, is heated, and its periphery is not substantially heated. In addition, pin hole can occur at the thin film due to the above-mentioned lower heat effect, and the step coverage is deteriorated.

Moreover, because the chemical source gas introducer 23 is simply connected to the introduction tube 23a passing through an upper portion of the reactor 22 and a lower portion of the introduction tube 23a and includes a shower head 23b having a plurality of shower apertures, so that substantial pre-heating and mixing of the introducing chemical source gas are not performed and the wafer "W" which is loaded on the substrate 24 cannot have substantial flooded by the chemical source gas, the uniformity level of the compound thin film is lowered.

In addition, since the wafer "W" mounted on the substrate is directly exposed to the lower portion of the shower head, the wafer "W" is not substantially exposed with respect to the chemical source gas, so that the uniformity level of the thin film is lowered.

Moreover, since the waste gas in the chemical reaction is exhausted from the outlet, and the gas in the reactor cannot be exhausted at a desired speed, the remaining gas affects the quality of the thin film.

Referring to FIGS. 1 and 2, since the conventional low pressure chemical vapor deposition apparatus and the conventional plasma low pressure chemical vapor deposition apparatus provide the substrates 14 and 24 which are connected to an upper portion of the lifting/lowering rams 15 and 25 and lifted/lowered within a range between the loading/unloading position and the deposition position, the desired precise loading/unloading cannot be achieved, disadvantageously affecting automation of the system.

In addition, referring to FIG. 4, the substrates 14 and 24 in the conventional low pressure chemical vapor deposition apparatus and the plasma low pressure chemical vapor deposition apparatus include the wafer placement sections 14b and 24b, on which the wafer "W" is mounted, being higher than the bodies 14a and 24a having the substrate heating member, and wafer supporting protrusions 14c and 24c provided at a periphery of the wafer placement sections 14b and 24b, so that the wafer "W" is stably placed on the wafer placement sections 14b and 24b in the support protrusions 14c and 24c.

However, conventionally, the wafer "W" having a flat zone "F" is circular and is mounted on the substrates 14 and 24 through the wafer inlets 11a and 12a using a robot hand "R". Here, since the fork-shaped robot hand "R" interferes with the wafer placement sections 14b and 24b during a certain operation mode, part of the both inner sides of the wafer placements 14b and 24b are cut away to be straight line sections 14d and 24d, so that the robot hand "R" freely operates between the straight line sections 14d and 24d. In addition, the width between the straight line sections 14d and 24d is smaller than the width between the inner sides of the fork of the robot arm "R".

In the above-mentioned construction, when lowering the robot hand "R" after moving the robot hand "R" to a position precisely mating with the wafer placement sections 14b and 24b, since the robot hand "A" is lowered at the outer side of the straight line sections 14d and 24d of the wafer placement sections 14b and 24b, there is not any interference between the robot hand "A" and the wafer placement sections 14b and 24b, and the wafer "W" is safely placed on the support protrusions 14c and 24cformed at the rim of the wafer placement sections 14b and 24b. When unloading the wafer, the operation is executed in the reverse order of the above-mentioned order.

However, referring to FIG. 3, when the wafer "W" is placed on the wafer placement sections 14b and 24b, since the both sides of the wafer "W" do not come into precise contact with the wafer placement sections 14b and 24b, that is, the wafer "W" slightly comes off from the straight line sections 14d and 24d of the wafer placement sections 14b and 24b, the heat of the substrate heating member in the substrate bodies 14a and 24a is not evenly transferred to the entire surface of the wafer "W", and a desired deposition cannot be executed with respect to the both sides of the wafer "W", and the deposition with respect to the lower surface of the wafer "W" is executed because the chemical source gas is introduced over part of the lower surface of the wafer "W" in a state that the both sides of the wafer "W" is slightly lifted.

In addition, referring FIGS. 4A and 4B, in order to resolve the above-mentioned problems, wafer lifting/lowering pins 17 and 28 (preferably three) which are lifted/lowered in the wafer placement sections 14b and 24b of the substrates 14 and 24 are provided. That is, as shown FIG. 4A, in a state that the wafer lifting/lowering pins 17 and 28 are lifted, the wafer "W" is positioned on the robot hand "A", and as shown in FIG. 4B, the wafer "W" is stably placed on the wafer placement sections 14b and 24b by lowering the lifting/lowering pins 17 and 28 unless the straight line sections of both sides of tile wafer placement sections 14b and 24b formed on the substrate bodies 14a and 24a are not provided.

However, in this case, a certain gap is formed between the substrate bodies 14a and 24a and the wafer lifting/lowering pins 17 and 28 when mounting the wafer lifting/lowering pins 17 and 28. The chemical source gas infiltrates through the gap causing particles. In addition, it is difficult to precisely dispose the substrate heating member and the electrodes in the substrate bodies 14a and 24a. Moreover, the gas infiltrated into the gap affects the substrate heating member causing heat loss. In addition, since the wafer lifting/lowering pins 17 and 28 are made of SUS or quartz, the wafer lifting/lowering pins 17 and 28 can easily broken, and it is difficult to maintain them.

SUMMARY OF THE INVENTION

Accordingly, it is an object of the present invention to provide an apparatus for a low pressure chemical vapor deposition, which overcome the problems encountered in the conventional low pressure chemical vapor deposition apparatus.

It is another object of the present invention to provide an improved apparatus for a lower pressure chemical vapor deposition capable of achieving various kinds of thin films having a uniform thickness, preventing parts breakage, achieving automation of the system, and combining the use of a low pressure chemical vapor deposition apparatus and a plasma low pressure chemical vapor deposition apparatus.

It is another object of the present invention to provide an improved apparatus for a lower pressure chemical vapor deposition, which can increase the quality of the compound thin film and is capable of preventing particle occurrence by increasing the heat efficiency and by pre-heating the reactor, its peripheral portion, and the wafer while the chemical source gas is introduced into the reactor using a substrate heating member.

It is another object of the present invention to provide an improved apparatus for a lower pressure chemical vapor deposition, which is capable of increasing the quality of a thin film deposition and of preventing the particle occupance by enhancing the heat efficiency so that the chemical source gas passes through the gas pre-heating region, the gas mixing region and a reaction region while the chemical source gas is introduced into the reactor.

It is another object of the present invention to provide an improved apparatus for a lower pressure chemical vapor deposition, which is capable of achieving a uniform thin film so that the temperature distribution is evenly provided by allowing the heat generated by the reactor heating member to be transferred to the reaction region by providing an indirect heat transfer member, at a periphery of the reactor, and a reactor, which are made of a material having an indirect heat transfer property.

It is another object of the present invention to provide an improved apparatus for a lower pressure chemical vapor deposition, which provides an indirect heat transfer and electrode member and a reactor which have a function of a plasma electrode, and are disposed at a periphery of the reactor, not additionally providing the plasma electrode at the reactor.

It is another object of the present invention to provide an improved apparatus for a lower pressure chemical vapor deposition, which provides an indirect heat transfer and electrode member or a reactor, which have a plasma electrode function, at a periphery of the reactor, not additionally providing a plasma electrode at the reactor.

It is another object of the present invention to provide an improved apparatus for a lower pressure chemical vapor deposition, which provides a heating jacket in which a heating medium circulates, thus conserving energy, not using any electric heater as a reactor heating member.

It is another object of the present invention to provide an improved apparatus for a lower pressure chemical vapor deposition, which expedites the dispersion of the chemical source gas by controlling the height of the dispersion plate of the chemical source gas disposed at the upper portion of the substrate on which the wafer is placed, so that even thin film can be achieved.

It is another object of the present invention to provide an improved apparatus for a lower pressure chemical vapor deposition, which provides a gas exhausting outlet for exhausting the reaction substances, gas and the like, so that the gas in the reactor is fast exhausted to the outside, thus enhancing the quality of thin film deposition.

It is another object of the present invention to provide an improved apparatus for a lower pressure chemical vapor deposition, which provides the lower surface of the wafer tightly contacting with the wafer placement section of the substrate, so that the wafer is evenly heated, thus enhancing even thickness of the thin film.

It is another object of the present invention to provide an improved apparatus for a lower pressure chemical vapor deposition, which is capable of correctly maintaining the loading/unloading position of the wafer.

It is another object of the present invention to provide a deposition base, a reactor placed on the deposition base and having a reactor, a substrate on which a wafer lifted/lowered therewithin is placed, a chemical source gas introducer for introducing the chemical source gas into the reactor, a heating member disposed at the substrate for heating the wafer, and a reactor heating member for heating the reactor, so that the heat efficiency can be enhanced by heating the wafer and the reactor at the same time.

The reactor and the chemical source gas introducer is constructed to substantially preheat and mix the chemical source gas.

It is another object of the present invention to provide a heating member between a reactor and a reactor heating member, to form a tube or a shower head constituting a reactor with a heating function material, so that the heat of the reactor heating member can heat the reactor through a convection or a heat transfer, thus evenly providing temperature distribution, and thus the product having a uniform thickness can be fabricated.

It is another object of the present invention to provide a substrate and a plasma generating member having an indirect heat transfer and electrode member with an electrode member function and an indirect heat transfer function, at the same time, so that the present invention can be adopted to deposit and etch.

It is another object of the present invention to provide a single gas introducing tube for introducing a chemical source gas, or to provide inner and outer gas introducing tubes for introducing at least two kinds of chemical source gases, so that various kinds of deposition films can be fabricated.

The substrate is directed to precisely placing the substrate by providing a position determination groove formed on the lower surface of the substrate and a position determination pin, mating with the position determination groove, disposed at an opening/closing plate when the substrate is positioned at a loading/unloading position, so that the automation of the system can be possible.

It is another object of the present invention to provide a chemical source gas distribution plate above the upper portion of the substrate, so that chemical source gas can be evenly provided onto the entire surface of the wafer, thus achieving uniform deposition films.

The substrate includes a substrate body having a placement section on which a certain portion of the wafer except the part of the both sides circular section thereof is placed. Here, there is further provided a wafer holder having an assistant placement section on which the both sides circular section of the wafer is placed, so that the wafer is safely placed on the substrate, thus preventing particles occurrences and achieving better heat transfer effects of the substrate heating member and uniform deposition films.

To achieve the above objects, in accordance with an embodiment of present invention, there is provided an apparatus for a low pressure vapor deposition, which includes a deposition base; a reactor disposed on the deposition base and having a reaction region formed therein; a substrate lifted and lowered in the reactor and on which a wafer is placed; a chemical source gas introducer for introducing a chemical source gas into the reactor; a substrate heating member disposed in the substrate for heating the wafer; and a reactor heating member for heating the reactor.

To achieve the above objects, in accordance with another embodiment of the present invention, there is provided an apparatus for a low pressure vapor deposition, which includes a deposition base; and a wafer holder having an assistant placement section, on which both sides circular sections of the wafer is placed, so that the wafer holder is lifted and lowered above the substrate body.

DETAILED DESCRIPTION OF THE INVENTION

Figure 1:
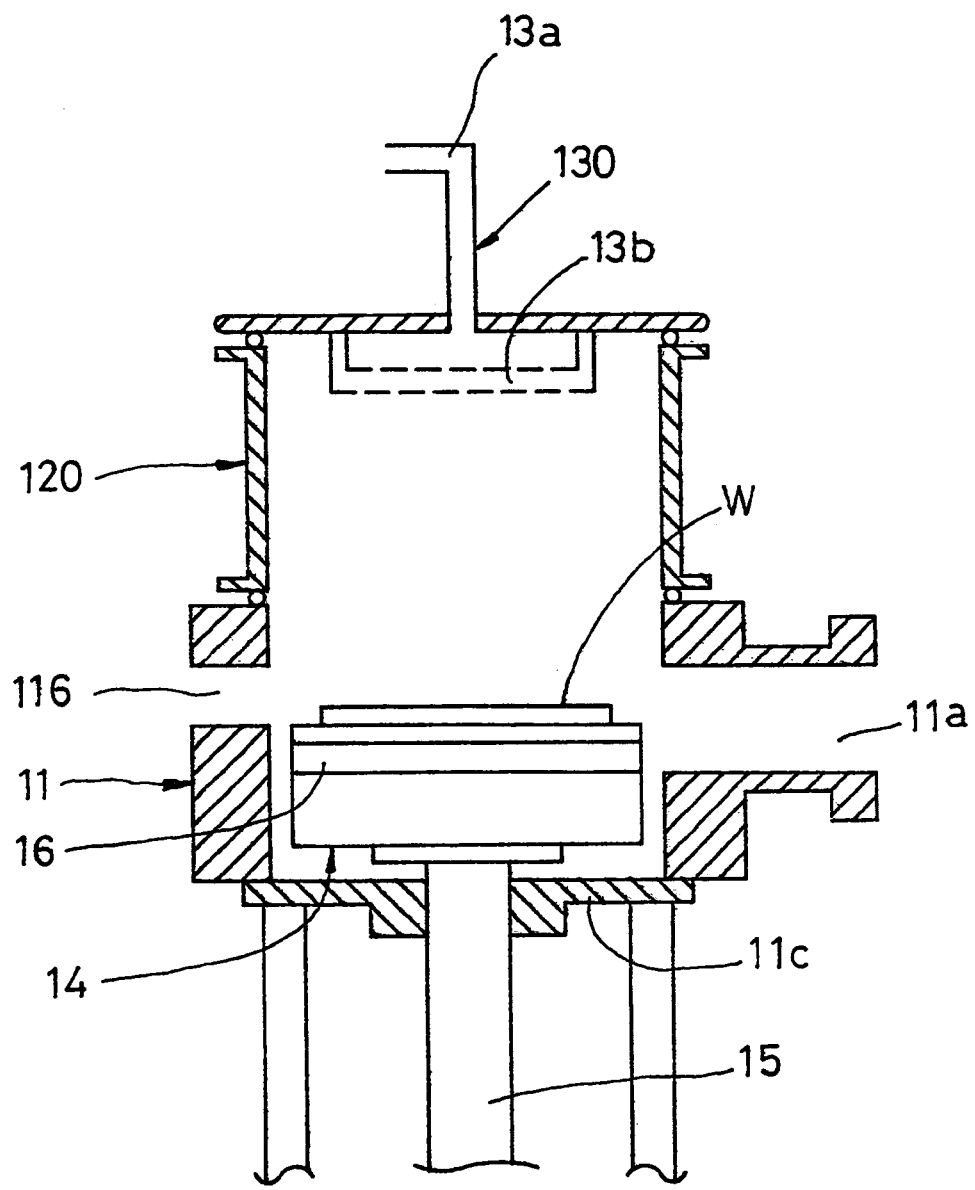
FIG. 1 is a cross-sectional view showing a conventional low pressure chemical vapor deposition apparatus.
Figure 2:
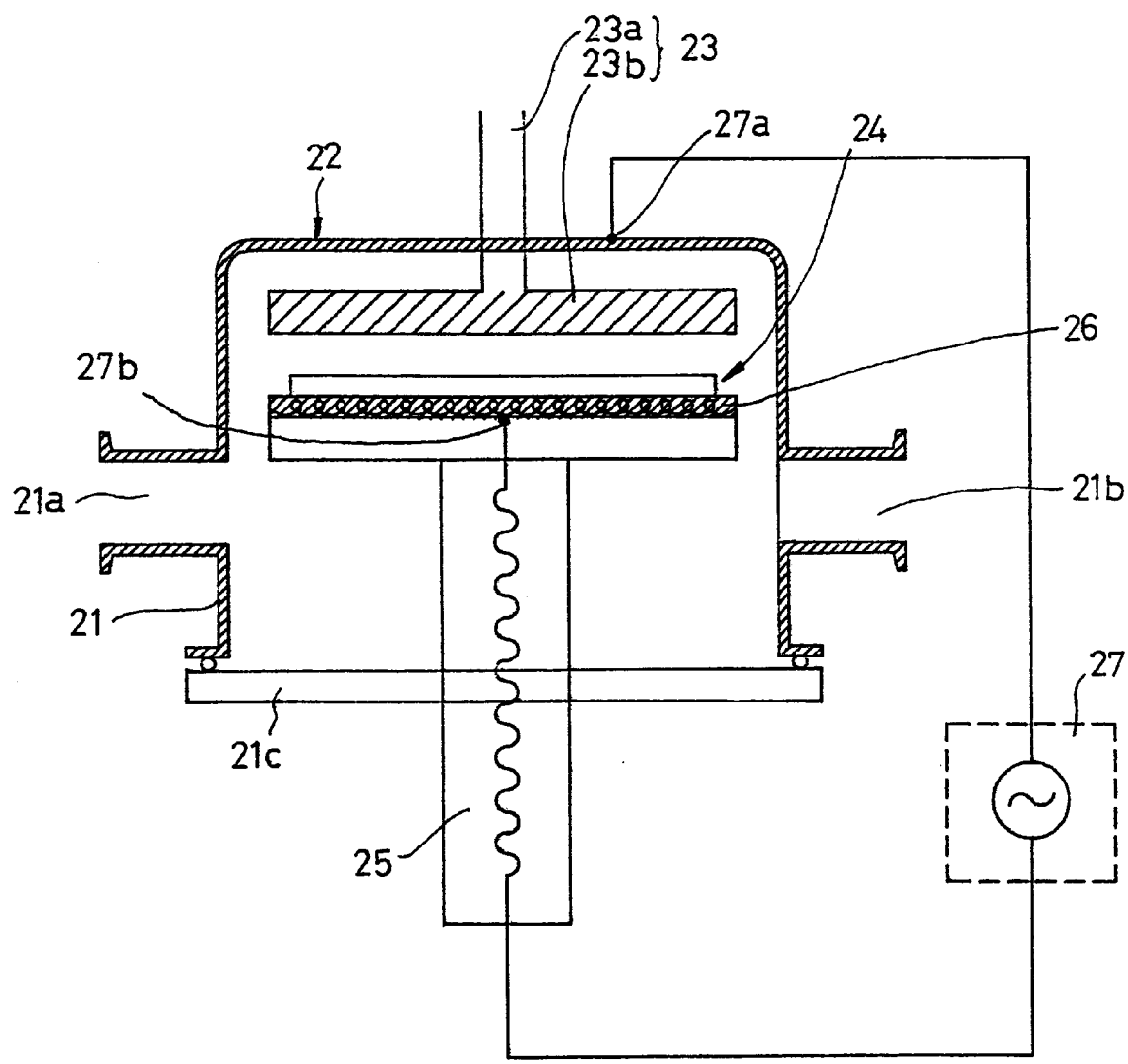
FIG. 2 is a cross-sectional view showing a conventional low pressure chemical vapor deposition apparatus.
Figure 3:
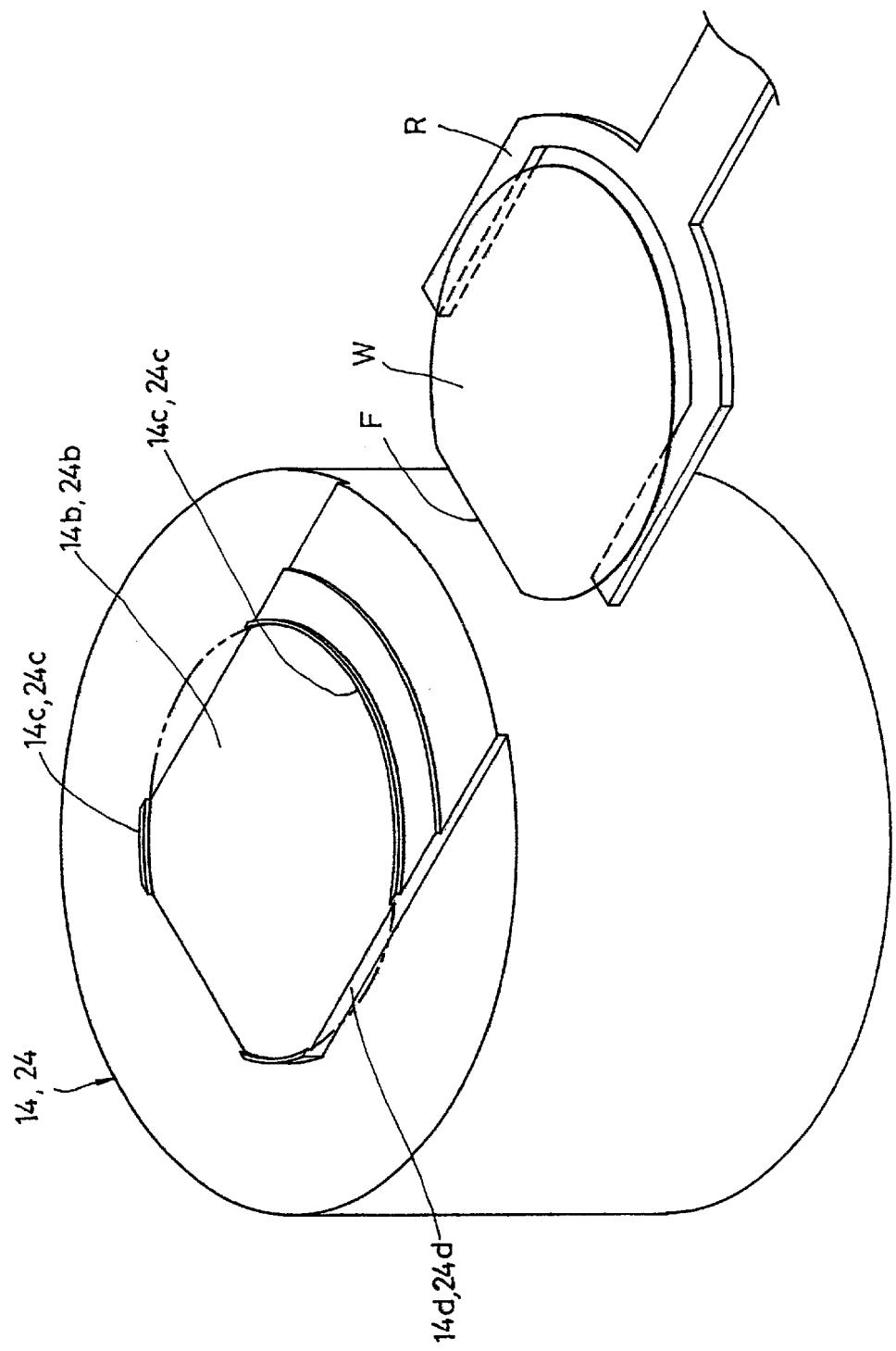
FIG. 3 is a perspective view showing a substrate of an embodiment adopted in the conventional low pressure chemical vapor deposition apparatus.
Figure 4A:
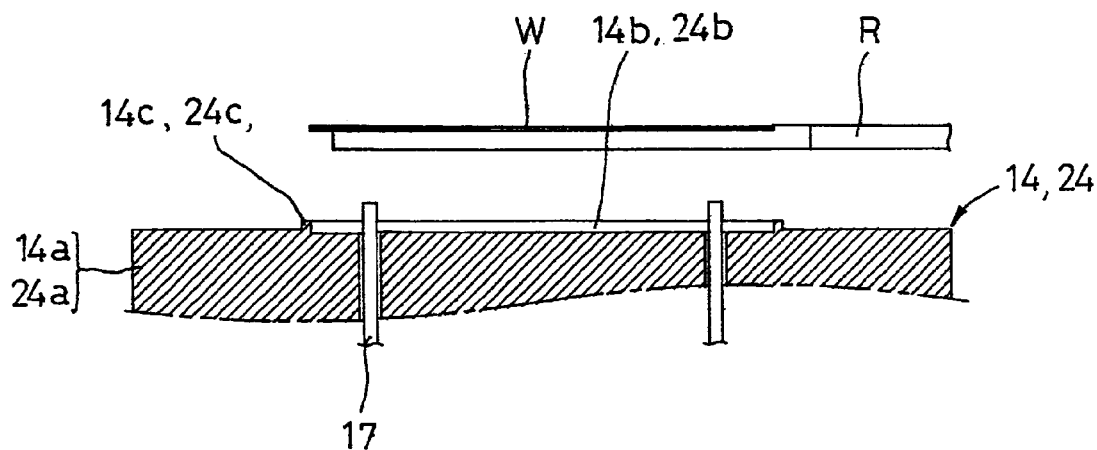
FIG. 4 is a cross-sectional view showing a substrate of another embodiment adopted in the conventional low pressure chemical vapor deposition apparatus.
Figure 4B:
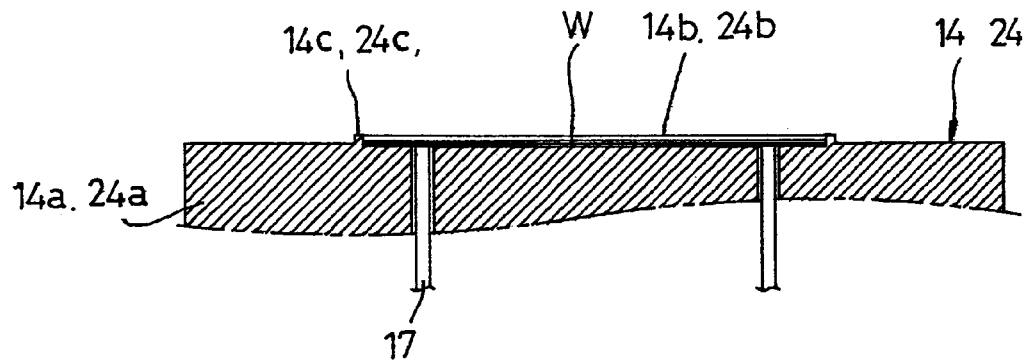
Figure 5:
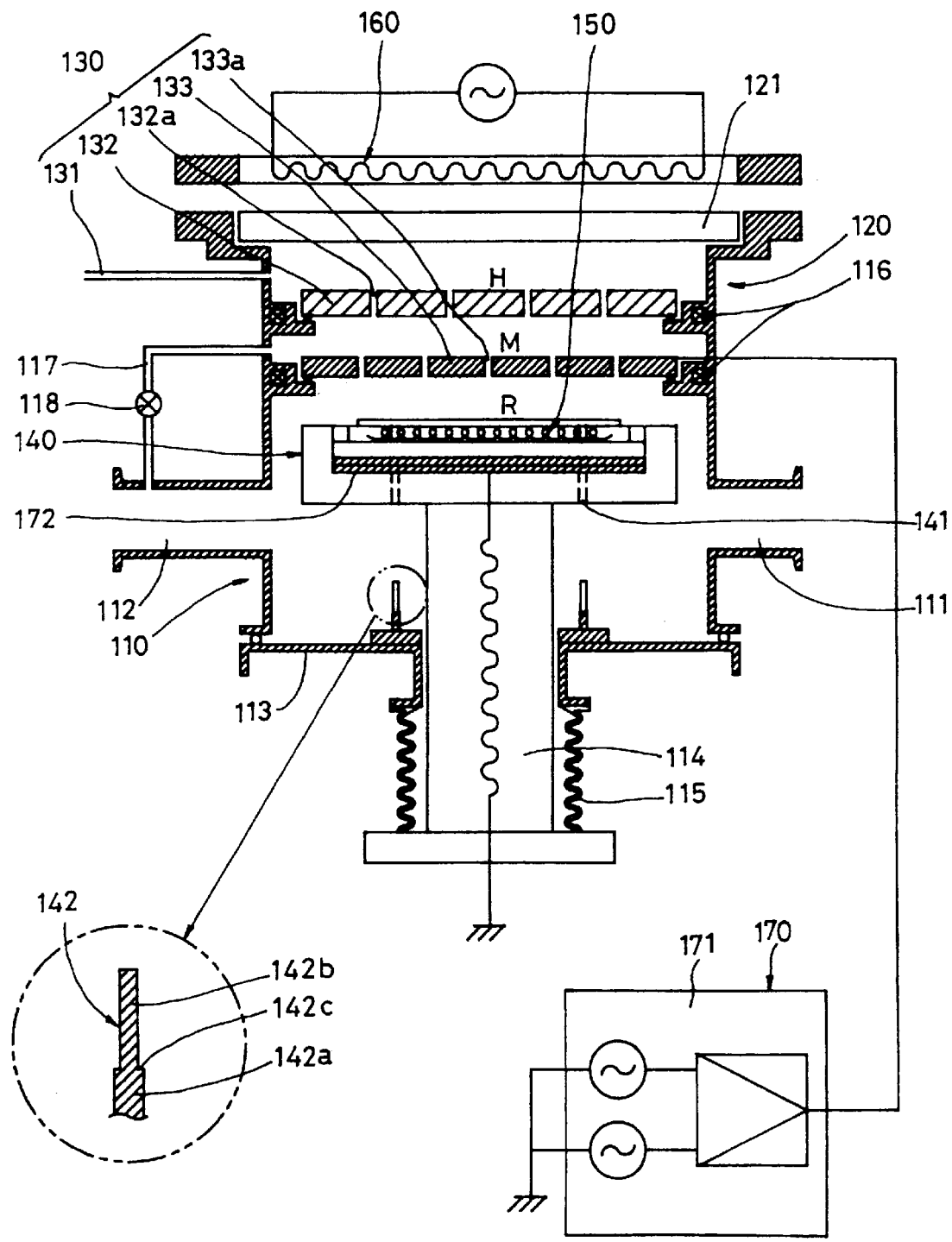
FIG. 5 is a cross-sectional view showing a low pressure chemical vapor deposition apparatus of a first embodiment according to the present invention.

FIG. 5 shows a low pressure chemical vapor deposition apparatus, which includes a deposition base 110 having a wafer inlet 111 for passing the wafer "W" therethrough and an outlet 112 for exhausting reaction substances therethrough, a reactor 120 mounted on an upper portion of the deposition base 110 and having a reaction region "R" therewithin, a chemical source gas introducer 130 connected to an upper portion of the reactor 120 for introducing chemical source gas into the interior of the reactor 120, a substrate 140 movable between the loading/unloading positions and the deposition position for receiving the wafer "W", a substrate heating member 150 inserted into the substrate 140 and disposed on the substrate 140 for heating the wafer "W", and a reactor heating member 160 disposed on an upper portion of the reactor 120 for heating the reactor 120.

The deposition base 110 is mounted on a deposition facility frame (not shown) and has an opening/closing plate 113 disposed at a lower portion of the deposition base 110 for opening/closing the interior of the deposition base 110. The opening/closing plate 113 has a lifting/lowering ram 114, and the substrate 140 is fixed to an upper portion thereof, and a dust cover 115 is provided between the opening/closing plate 113 and the lifting/lowering ram 114 so as to prevent foreign matter or gas from infiltrating into the reactor 120 through a certain gap of the lifting/lowering ram 114.

The lifting/lowering ram 114 is lifted/lowered by a lifting/lowering driving member (not shown) which is of a linearly reciprocating mechanism.

In one aspect of the present invention, the deposit ion base 110 and the reactor 120 are integrally formed; however, it is not limited to that. In another aspect of the present invention, they can be made independently from each other. In this regard, tightly engaging the deposition base 110 and the reactor 120 is necessary.

The reactor 120 typically adopts quartz, and the upper portion thereof is closed by a sealing member 121. According to its first function, the sealing member 121 is directed to substantially blocking the interior of the reactor 120 from the outside or sealing the interior thereof using a quartz plate. According to its self function, the sealing member 121 adopts a SiC plate so as to indirectly transfer the heat of the reactor heating member 160 into the interior of the reactor, not to directly transfer the heat thereof thereto.

The chemical source gas introducer 130 includes an introduction tube 131 connected to an upper portion of the reactor 120, a first shower head 132 spaced-apart from and disposed at a lower portion of the sealing member 121 and a second shower head 133. A gas pre-heating region "H" is defined between the sealing member 121 and the first shower head 132 for pre-heating the chemical source gas, and a gas mixing region "M" is defined between the first shower head 132 and the second shower head 133, and a reaction region "R" is defined below the second shower head 133 in which a chemical source gas is reacted.

The first shower head 132 and the second shower head 133 have shower apertures 132a and 133a, and the shower aperture 133a of the second shower head 133 has larger diameter than that of the shower aperture 132a of the first shower head 132 and the number thereof is more than that of the shower aperture 132a of the first shower head 132.

The first shower head 132 uses an original quartz plate, and the second shower head 133 uses a conductive plate such as a SiC plate for co-use of the electrode so as to generate plasma.

In case of using a SiC plate as the second shower head, since the material thereof is non-transparent, the heat of the reactor heating member 160 is not directly transferred to the reaction region "R", that is, the heat thereof is indirectly transferred thereto by conduction or convection.

The substrate 140 is formed with a quartz plate, a carbon plate or a SiC plate and has a certain space for receiving the substrate heating member 150.

A plurality of position determination grooves 141 (in drawings, only two are seen) are formed on the lower surface of the substrate 140, and the opening/closing plate 113 includes a protruded position determination pin 142 with respect to the position determination groove 141.

As enlarged in the circle in FIG. 5, the position determination pin 142 includes a support section 142a fixed to the opening/closing plate 113 integral with an insertion section 142b, which has a certain diameter smaller than that of the support section 142a, inserted into the position determination groove 141, and an engaging jaw 142c for supporting the lower surface of the substrate 140. The height of the engaging jaw 142c is subject to the position of the loading/unloading position of the substrate 140. In addition, the position determination pin 142 is threadably engaged to the opening/closing plate 113, so that the height of the engaging jaw 142c can be controlled.

The substrate heating member 150 disposed in the inner upper portion of the substrate 140 is preferably an electric heater.

The reactor heating member 160 disposed at an upper portion of the reactor 120 is preferably an electric heater or an SiC heater.

The plasma generating member 170 is disposed between the reactor 120 and the substrate 140 for generating plasma in the reaction region "R", and a high frequency voltage generated by a high frequency generator 171 is applied to the second shower head 133 and the substrate 140, respectively.

Reference numeral 116 denotes a cooling water path.

The operation of the lower pressure chemical vapor deposition apparatus will now be explained with reference to the accompanying drawings.

To begin with, the substrate 140 is lowered down to a loading/unloading position by lowering the lifting/lowering ram 114, and a wafer "W" is placed on the substrate 140 through the wafer inlet 111 in a state that a certain pressure in maintained in the reactor 120 using a vacuum pump (not shown).

At this time, the insertion section 142b of tile position determination pin 142 fixed to the opening/closing plate 113 in a state that the substrate 140 is lowered down to the loading/unloading position is inserted into the position determination groove 141 formed on the substrate 140, and the lower surface of the substrate 140 is restricted by the engaging jaw 142c of the position determination pin 142, so that the position of the substrate 140 is precisely determined, thus positioning the wafer "W" on the substrate 140 using a certain member such as a robot hand.

In a state that the wafer "W" is placed on the substrate 140, the substrate 140 is lifted up to the deposition position by the lifting/lowering ram 114.

Thereafter, the wafer "W" mounted on the substrate and the reactor 120 are heated at temperature of 100 through 1,100° C. by driving the substrate heating member 150 and the reactor heating member 160, and the chemical source gas is introduced into the reactor 120 by the chemical source gas introducer 130.

The chemical source gas introduced into the introduction tube 131 of the chemical source gas introducer 130 is first introduced into the gas pre-heating region "H" which is defined at the uppermost portion of the reactor 120, and is pre-heated by the reactor heating member 160, and the chemical source gas is gushed toward the gas mixing region "M" through the shower aperture 132a of the first shower head 132.

At this time, since the shower aperture 133a of the second shower head 133 has a certain diameter smaller than that of the shower aperture 132a of the first shower head 132, and the number thereof is greater than that of the shower aperture 132a of the first shower head 132, the chemical source gas introduced into the gas mixing region "M" is substantially mixed therein for a certain time.

The chemical source gas introduced into the reaction space "R" through the shower aperture 133a of the second shower head 133 is reacted in the reactor 120 which is pre-heated to have a predetermined temperature by the reactor heating member 160 and deposited on the wafer "W" on the substrate 140 as a compound thin film.

The wafer "W" mounted on the substrate 140 and the gas mixing region "M" are heated by the substrate heating member 150 and the reactor heating member 160, and the chemical source gas is introduced into the reaction region "R" in a state that the gas is substantially heated, so that a desired heat effect is achieved. In addition, since the chemical source gas is substantially heated through the gas pre-heating region "H" and the gas mixing region "M" which are defined by the first shower head 132 and the second shower head 133 and introduced thereinto, pin holes, cracks, and step coverage do not occur in the thin film, so that it is possible to obtain a desired better thin film.

When the deposition is completed, reaction substances or remaining gas in the reactor 120 are discharged to the outside through the outlet 112, and the substrate 140 is lowered down to the loading/unloading position by the lifting/lowering ram 114, and the wafer "W" is unloaded through the wafer inlet 111 using a unloading member such as a robot hand.

In a state that the substrate 140 is lowered down to the loading/unloading position, the unloading operation can be more precisely executed in cooperation with the position determination groove 141 of the substrate 140 and the position determination pin 142 disposed at the opening/closing plate 113.

In addition, the reaction substances or remaining gas are properly exhausted through the outlet 112 of the deposition base 110.

Meanwhile, in this embodiment, the gas mixing region "M" and the outlet 112 are connected by a remaining gas exhausting tube 117 having an opening/closing valve 118 disposed at its intermediate position.

The remaining gas exhausting tube 117 is closed during a deposition process by closing the opening/closing valve 118 so that the chemical source gas introduced into the reactor 120 is not exhausted to the outside through the remaining gas exhausting tube 117 or the foreign matters such as air is not introduced thereinto.

After the deposition is completed and the wafer "W" is unloaded, the reaction substances and remaining gas in the gas mixing region "M" are exhausted to the outside at a desired speed by opening the opening/closing valve 118, that is, by connecting the gas mixing region "M" and the outlet 112.

Here, since the gas mixing region "M" has a relatively small diameter, it takes some time for the remaining gas in the gas mixing region 133 to be exhausted from the reaction region "R" to the outlet 112 through the shower aperture 133a of the second shower head 133, the thin film deposition may be damaged thereby. In order to resolve the above-mentioned problems, this embodiment of the present invention is directed to providing the remaining gas exhausting tube 117 connecting between the gas mixing region "M" and the outlet 112 and to opening the opening/closing valve 118 during a unloading operation, so that the remaining gas in the gas mixing region "M" is fast exhausted to the outside, and thus it is possible to prevent the thin film deposition.

In addition, this embodiment of the present invention is directed to fabricating better thin film by expediting the reaction of the chemical source gas by generating plasma in the reaction region "R" by applying a high frequency voltage to the reactor 120 and the substrate 140.

That is, using the plasma generator 171, a high frequency voltage is applied between the second shower head 133 formed with SiC material and the electrode 172 disposed at the substrate 140, and plasma is generated therebetween, and the chemical source gas is substantially pre-heated through the first shower head 132 and the second shower head 133, and the a desired reaction can be achieved by the plasma discharge. Here, in order to reduce fabricating cost of the product, the second shower head 133 can be used as the electrode, not providing additional electrode to the reactor 120.

Figure 6:
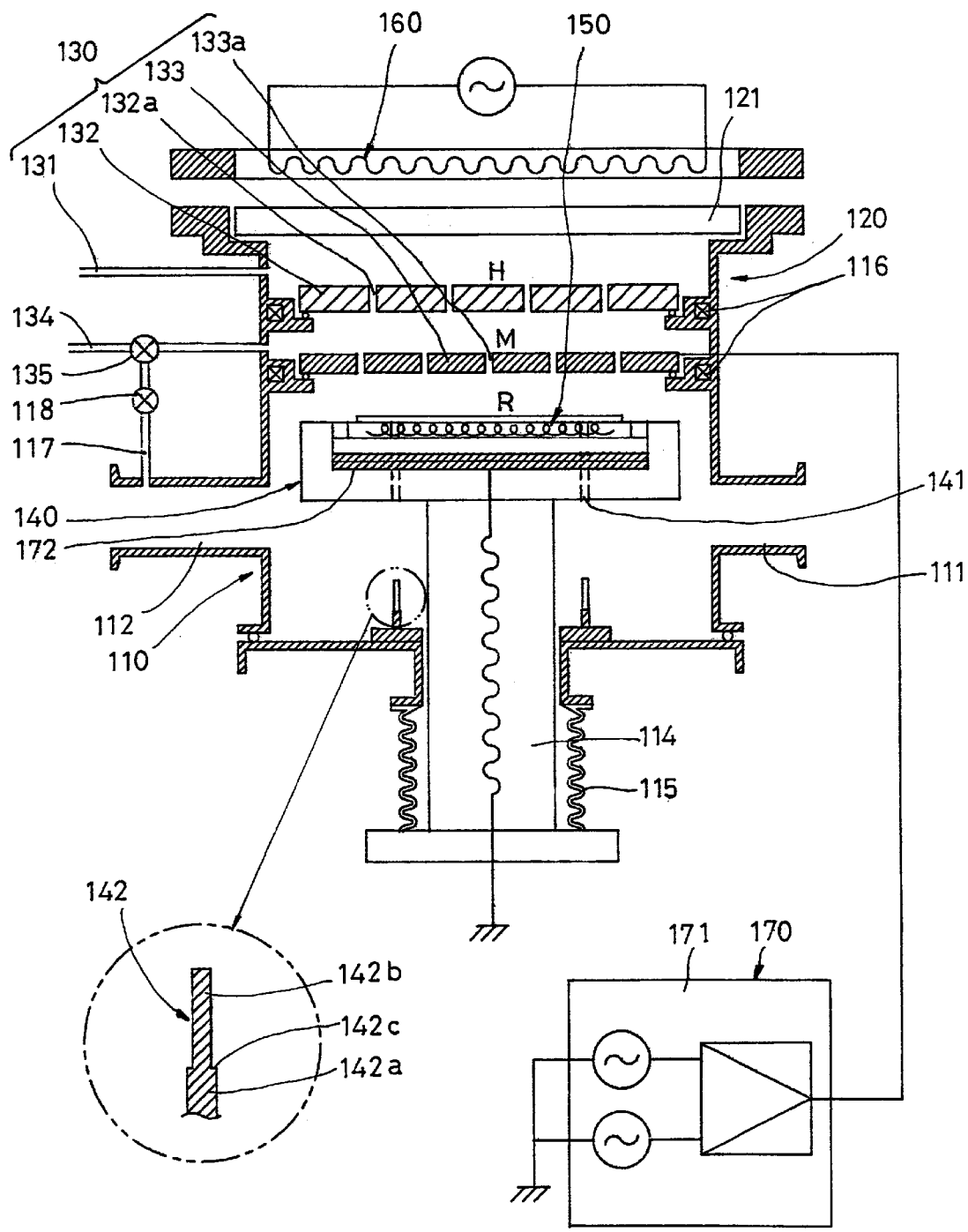
FIG. 6 is a cross-sectional view showing a low pressure chemical vapor deposition apparatus of another embodiment according to the present invention.

FIG. 6 shows a low pressure chemical vapor deposition apparatus of another embodiment according to the present invention by changing the construction of the chemical source gas introducer 130. That is, this embodiment is directed to providing an assistant introduction tube 134 at the remaining gas exhausting tube 117 and a conversion valve 135 between the remaining gas exhausting tube 117 and the assistant introduction tube 134.

That is, in a state that the exhausting valve 118 is closed and the conversion valve 135 is opened between the assistant introduction tube 131 and the gas mixing region "M" during a deposition process, the chemical source gas in introduced into the gas pre-heating region "H" through the introduction tube 131 and introduced into the gas mixing region "M" through the assistant introduction tube 134, so that various kinds of thin films can be achieved by introducing various kinds of chemical source gases into the introduction tube 131 and the assistant introduction tube 134.

During a unloading process after the deposition is completed, the assistant introduction tube 134 connected to the gas mixing region "M" is closed by the conversion valve 135 and the remaining gas exhausting tube 117 connected to the gas mixing region "M" is opened by the conversion valve 135, so that the remaining gas in the gas mixing region "M" is fast exhausted to the outside through the remaining gas exhausting tube 117, and thus better thin film can be achieved.

Since the operation of this embodiment is the same as the first embodiment, it will be omitted.

Figure 7:
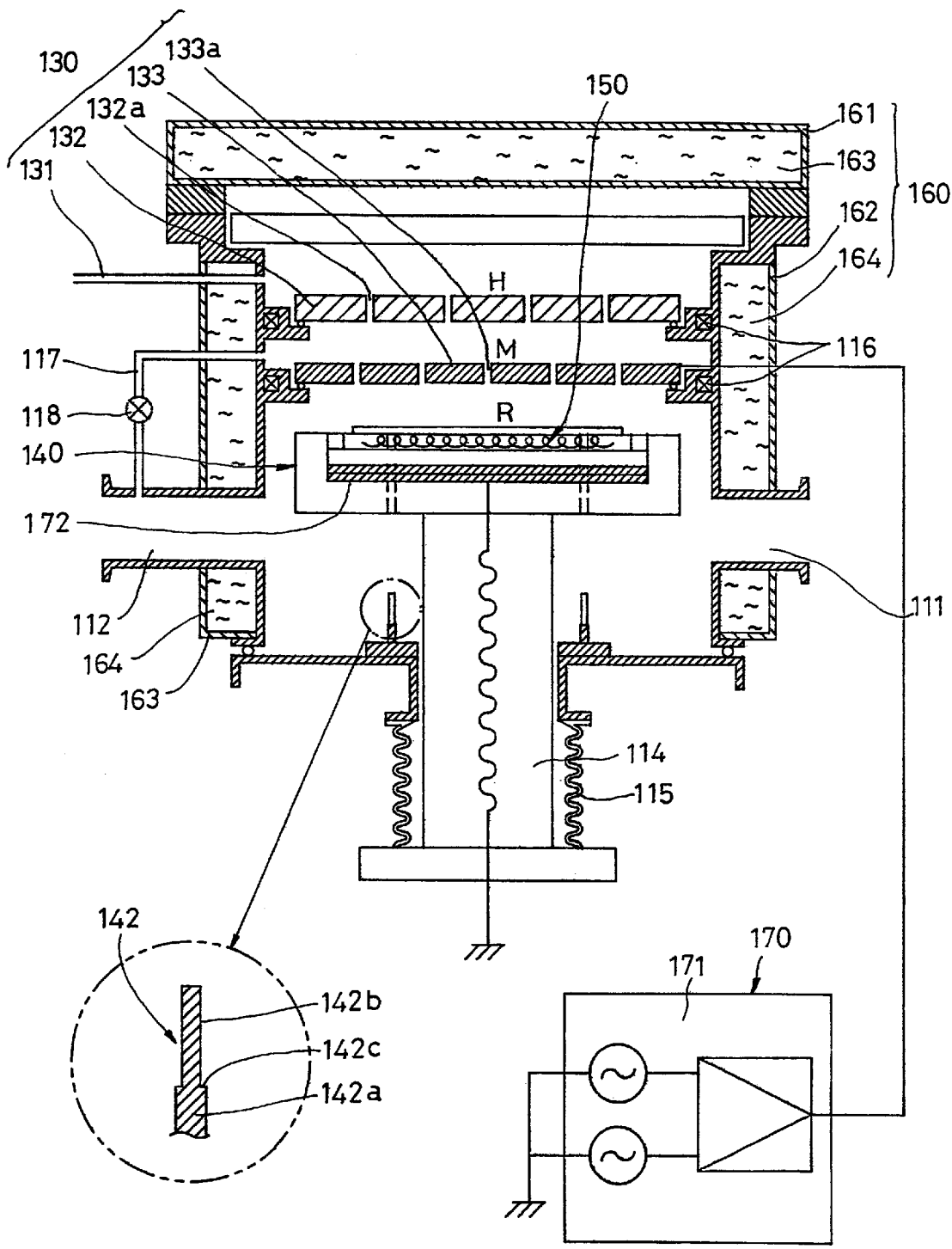
FIG. 7 is a cross-sectional view showing a low pressure chemical vapor deposition apparatus of another embodiment according to the present invention.

FIG. 7 shows a low pressure chemical vapor deposition apparatus of another embodiment according to the present invention by changing the construction of the reactor heating member 160, which includes a jacket 161 wound around the walls of the deposition base 110 and the reactor 120 and another jacket 162 disposed at an upper portion of the reactor 120, so that heating medias 163 and 164 are circulated within the jackets 161 and 162.

The heating medias 163 and 164 can be high temperature vapor or ethylene glycol. When using high temperature vapor, it is necessary to provide a certain boiler so as to generate high temperature vapor, so that the system is costly and bulky. As a result, ethylene glycol is preferably used in the system by heating the same using a certain heating member (not shown).

Since the remaining elements are the same as the previously described embodiment, the descriptions will be omitted.

Figure 8:
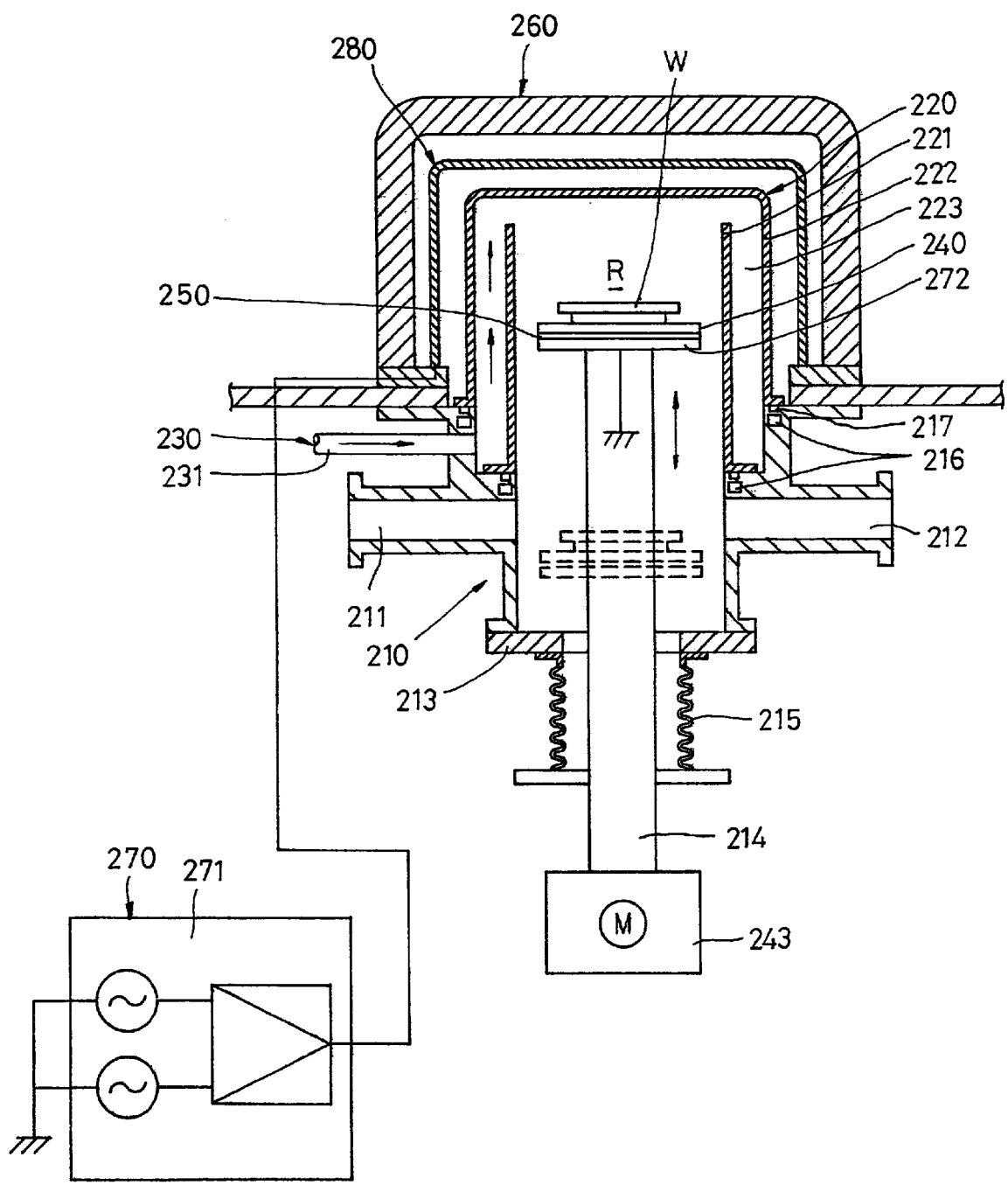
FIG. 8 is a cross-sectional view showing a low pressure chemical vapor deposition apparatus of a second embodiment according to the present invention.

FIG. 8 shows a lower pressure chemical valor deposition apparatus of another embodiment according to the present invention, which includes a deposition base 210 having a wafer inlet 211 formed at one side thereof and an outlet 212 formed at the other side thereof for exhausting reaction substances therethrough, a reactor 220 disposed in the upper portion of the deposition base 210 and having a reaction region "R" formed therewithin, a source gas introducer 230 connected to the upper portion of the reactor 220 for introducing the chemical source gas into the reactor 220, a substrate 240, on which the wafer "W" is mounted, being movable within a range between a loading/unloading position and a deposition position, and a substrate heating member 250 disposed in the substrate 240 for heating the wafer "W". Here, this embodiment further includes a reactor heating member 260 disposed at a periphery of the reactor 220 for heating the reactor 220, which is similar to the first embodiment. However, compared with the first embodiment, the constructions of the reactor 220 and the chemical source gas introducer 230 are different therefrom. In addition, there are further provided a substrate rotation member 243 for rotating the substrate 240 and an electrode member 280 disposed between the reactor 220 and the reactor heating member 260.

That is, the lower aperture of the deposition base 210 can opened/closed by the opening/closing plate 213, and a lifting/lowering ram 214 is passing through the substrate 240 and disposed through the opening/closing plate 213.

The reactor 220 includes an upper portion- and lower portion-opened hollow inner tube 221, an upper portion-closed and lower portion-opened outer tube 222, and a chemical source gas flowing path 223 formed between the inner and outer tubes 221 and 222.

Here, the upper portion of the inner tub 221 is lower than that of the outer tube 222, and the chemical source gas flowing path 223 and the reaction region "R" are connected to each other through the space between the inner and outer tubes 221 and 222.

The chemical source gas introducer 230 includes an introducer 231 connected to a lower portion of the chemical source gas flowing path 223.

The lifting/lowering ram 214 for lifting/lowering the substrate 240 is rotatable by the substrate rotation member 243 and is directed to executing a lifting/lowering operation and a rotation operation, respectively.

The substrate heating member 250 is disposed within the inner upper portion of the substrate 240 and is directed to heating the wafer "W" which is mounted on the substrate 240.

The reactor heating member 260 winds around the upper portion and walls of the reactor 220 and is mounted to be lower than the lower surface of the substrate 240.

Here, the reactor heating member 260 can be a commonly used electric heater, or as shown in FIG. 7, it can be directed to heating and circulating ethylene glycol by providing jacket.

An indirect electric heat and electrode 280 is disposed between the upper surfaces of the reactor 220 and the reactor heating member 260.

The indirect electric heat and electrode 280 is formed with a certain material having conductivity and having a characteristic that the transmission of the heat of the reactor to the interior of the reactor 220 is reduced, that is, the heat thereof is indirectly transferred to the interior thereof. For example, it is formed of SiC material or the like.

In drawings, reference numeral 215 denotes a flexible dust cover, and 216 denotes a cooling water circulation path, 217 denotes a packing provided between the deposition base 210 and the lower portion of the inner and outer tubes 221 and 222.

The operation of the low pressure chemical vapor deposition apparatus will now be explained with reference to the accompanying drawings.

To begin with, the substrate 240 is lowered down to the loading/unloading position by the lifting/lowering ram 214.

Thereafter, in a state that a predetermined pressure in the reactor is maintained by a vacuum pump (not shown), the wafer "W" is placed on the substrate 240 through the wafer inlet 211, and the substrate 240 is lifted up to the deposition position by the lifting/lowering ram 214.

Thereafter, the substrate heating member 250 and the reactor heating member 260 are driven. The chemical source gas is introduced into the reactor 220 while heating the wafer "W" placed on the substrate 240 and the reactor at a temperature of 100 through 1,100° C.

The chemical source gas introducer 231 introduced into the chemical source gas introducer 230 is introduced into the reaction region "R" through the chemical source gas flowing path 223 formed between the inner and outer tubes 221 and 222 of the introduction tube 231.

The chemical source gas is substantially pre-heated through the chemical source gas flowing path 223, and the chemical source gas in the reactor 220 is heated by a predetermined temperature by the reactor heating member 260 and is reacted in the reactor so as to deposit a compound thin film on the wafer "W" mounted on the substrate 240.

Since the chemical source gas in the above-mentioned process is substantially pre-heated through the chemical source gas flowing path 223 and is introduced into the reaction region "R" of the reactor 220, so that the heat effect is increased, and thus it is possible to obtain a better thin film without pin holes, cracks, and step coverage.

In addition, since this embodiment of the present invention provides the substrate rotation member 243 in the lifting/lowering ram 214 for lifting/lowering the substrate 240 so as to rotate the substrate, it is possible to obtain more even thin film by a uniform chemical source gas flowing with respect to the wafer "W".

Meanwhile, since this embodiment of the present invention provides the plasma generator 270 connected to the reactor 220 and the substrate 240 for generating plasma in the reaction region "R" by applying a high frequency voltage between the reactor 220 and the substrate 240, so that a better thin film deposition can be achieved by expediting the reaction of the chemical source gas in the reactor 220, and the inner surface of the reactor 120 can be etched.

That is, when the plasma generator 271 is driven, a high frequency voltage is applied between the indirect electric heat and electrode member 280 formed of SiC or carbon materials and the electrode 272 disposed at the substrate 240, and plasma is generated therebetween, so that the chemical source gas in the chemical source gas flowing path 223 is substantially pre-heated, and the reaction of the chemical source gas is more expedited by the plasma discharging. Here, there is no need to additionally locate an electrode at the side of the reactor 220, thus reducing the number of parts. In addition, it is possible to use more simple assembly line, and fabrication of the product is not costly.

Figure 9:
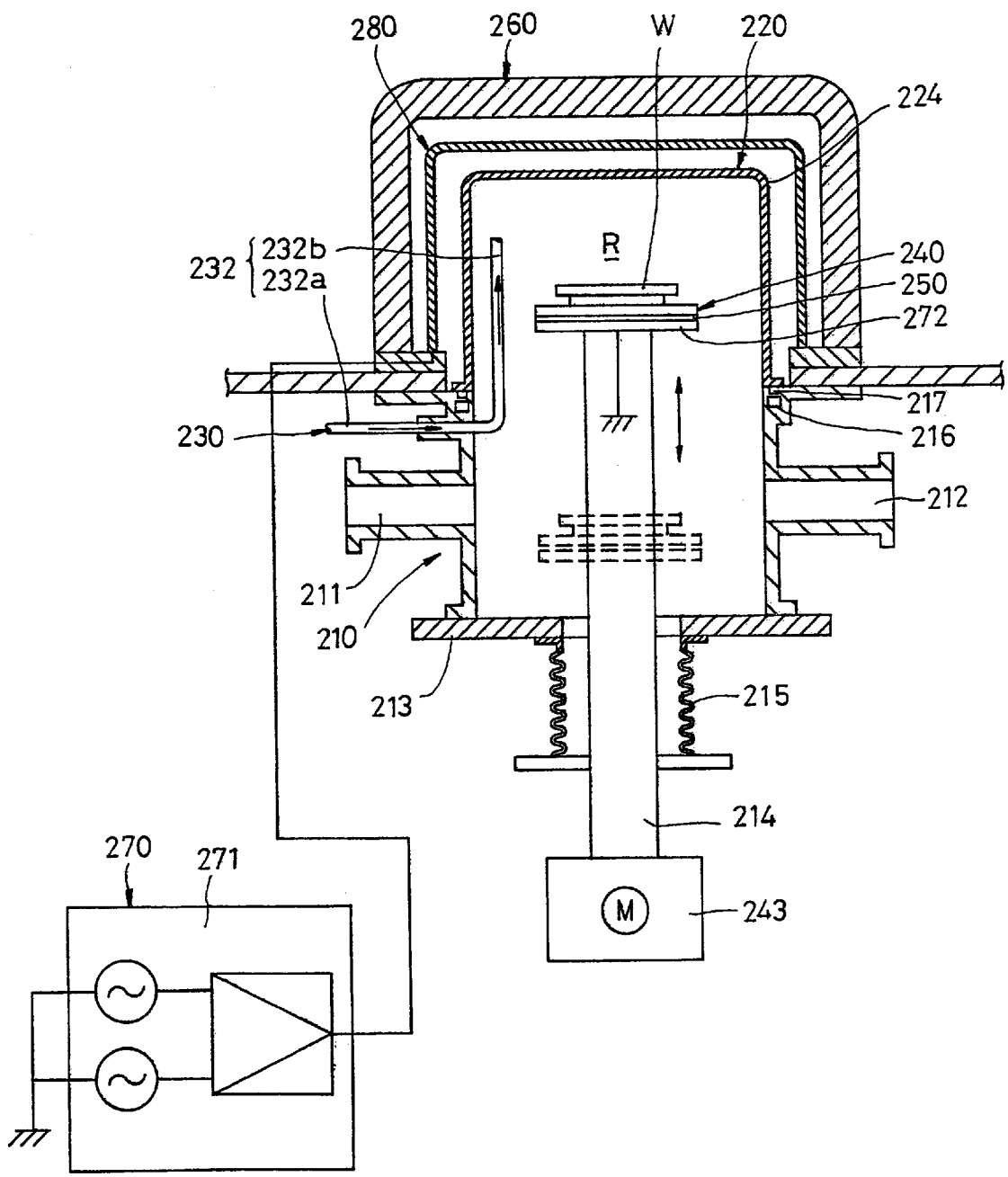
FIG. 9 is a cross-sectional view showing a low pressure chemical vapor deposition apparatus of a third embodiment according to the present invention.

FIG. 9 shows a low pressure chemical vapor apparatus of a third embodiment according to the present invention. This third embodiment of the present invention is directed to changing the construction of the reactor 220 and the chemical source gas introducer 230. The construction except the above-mentioned elements are the same as the second embodiment, the description thereof will be omitted.

That is, in more detail, the low pressure chemical vapor apparatus of the third embodiment includes a reactor 220 having a lower portion-opened and upper portion-closed tube 224, a horizontal section 232a extended to the interior of the reactor 220 and passing through a side wall of the deposition base 210, and an introduction tube 232 integral with a vertical section 232b which is upwardly curved from the inner side of the horizontal section 232a.

Here, the upper portion of the vertical section 232b of the introduction tube 232 is higher than that of the substrate.

This embodiment of the present invention is directed to introducing the chemical source gas into the upper portion of the reaction region "R" and has a more simple tube 224, so that the chemical source gas is substantially heated through the vertical section 232b. As a result, this embodiment can achieve a similar result compared with the second embodiment.

Figure 10:
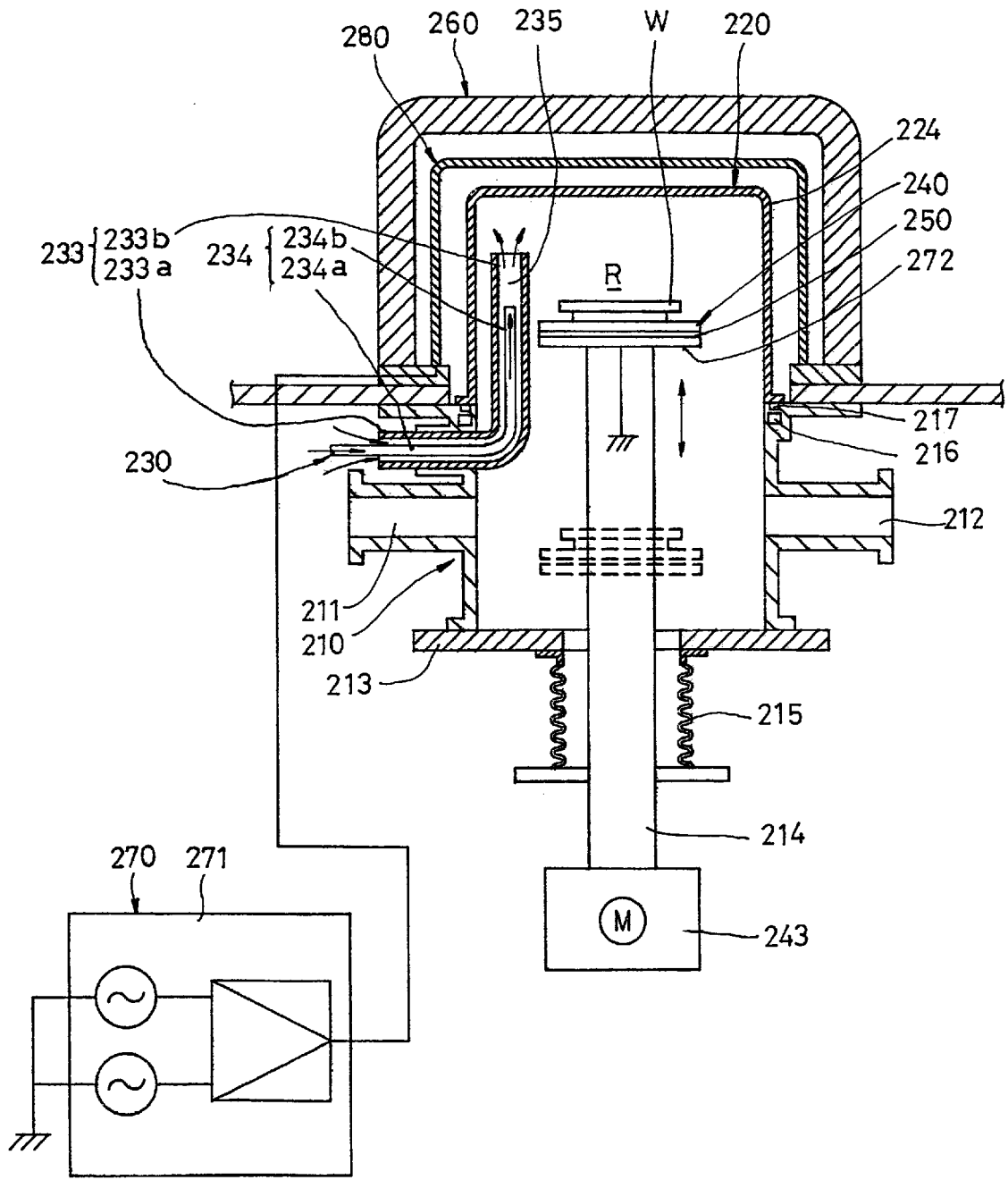
FIG. 10 is a cross-sectional view of a low pressure chemical vapor deposition apparatus of another embodiment according to the present invention.

FIG. 10 shows a low pressure chemical source gas apparatus of another embodiment of the third embodiment according to the present invention. That is, this embodiment is directed to providing another embodiment of the chemical source gas introducer 230, which includes a horizontal section 233a passing through the side wall of the deposition base, an outer introduction tube 233 having a vertical section 233b upwardly curved from the inner end of the horizontal section 233a and a great diameter, and an inner introduction tube 234 having a horizontal section 234a and a vertical section 234b which are inserted into the interior of the horizontal section 233a and the vertical section 233b of the outer introduction tube 233, so that various kinds of chemical source gases can be introduced into the reactor through an introduction path between the inner and outer introduction tubes 234 and 233 and an induction tube of the interior of the inner introduction tube 234, and thus various kinds of thin film depositions can be achieved.

The upper portion of the vertical section 233b of the outer induction tube 233 is higher than the deposition position of the substrate. In addition, the height of the upper portion of the vertical section of the inner induction tube 234 is preferably similar to the deposition position of the substrate because the chemical source gas introduced through above two introduction paths is well mixed at a space 235 between the upper portion of the vertical section of the inner introduction tube 234 and the upper portion of the vertical section 233b of the outer introduction tube 233, so that a better thin film deposition can be achieved.

Figure 11:
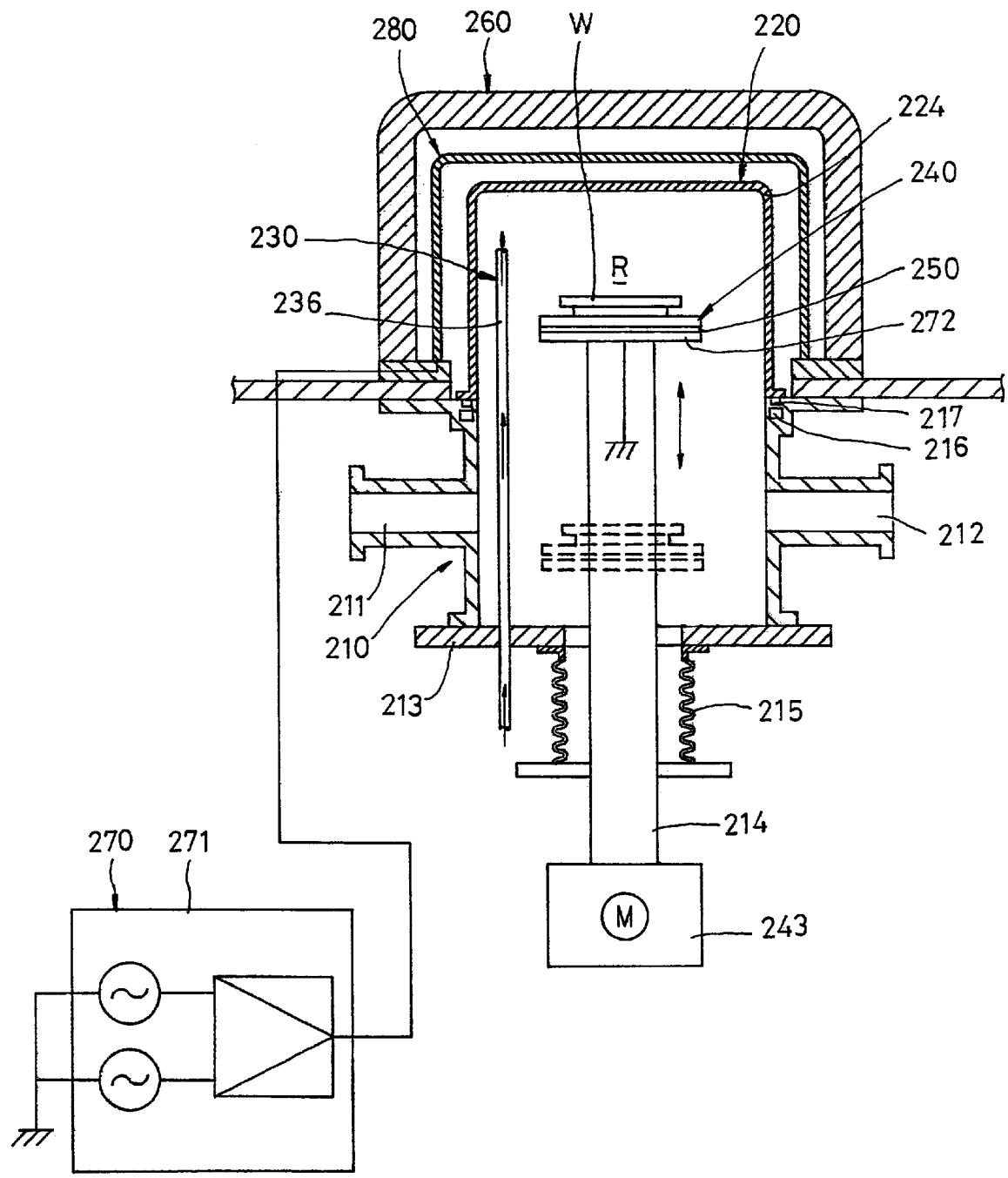
FIG. 11 is a cross-sectional view of FIG. 9 of a third embodiment according to the present invention.

FIG. 11 shows a low pressure chemical vapor deposition apparatus of another embodiment of the third embodiment according to the present invention, which is directed to changing the construction of the chemical source gas introducer 230.

That is, the chemical source gas introducer 230 of this embodiment includes an introduction tube 236 of which the upper portion thereof is extended to a predetermined portion higher than the deposition position of the substrate and vertically passes through the opening/closing plate 213 for opening/closing the lower portion of the deposition base 210.

Since the chemical source gas is substantially heated through the introduction tube 236 by the heat of the reactor heating member 260 and is introduced into the reaction region "R", the effects similar to the second embodiment can be achieved.

Figure 12:
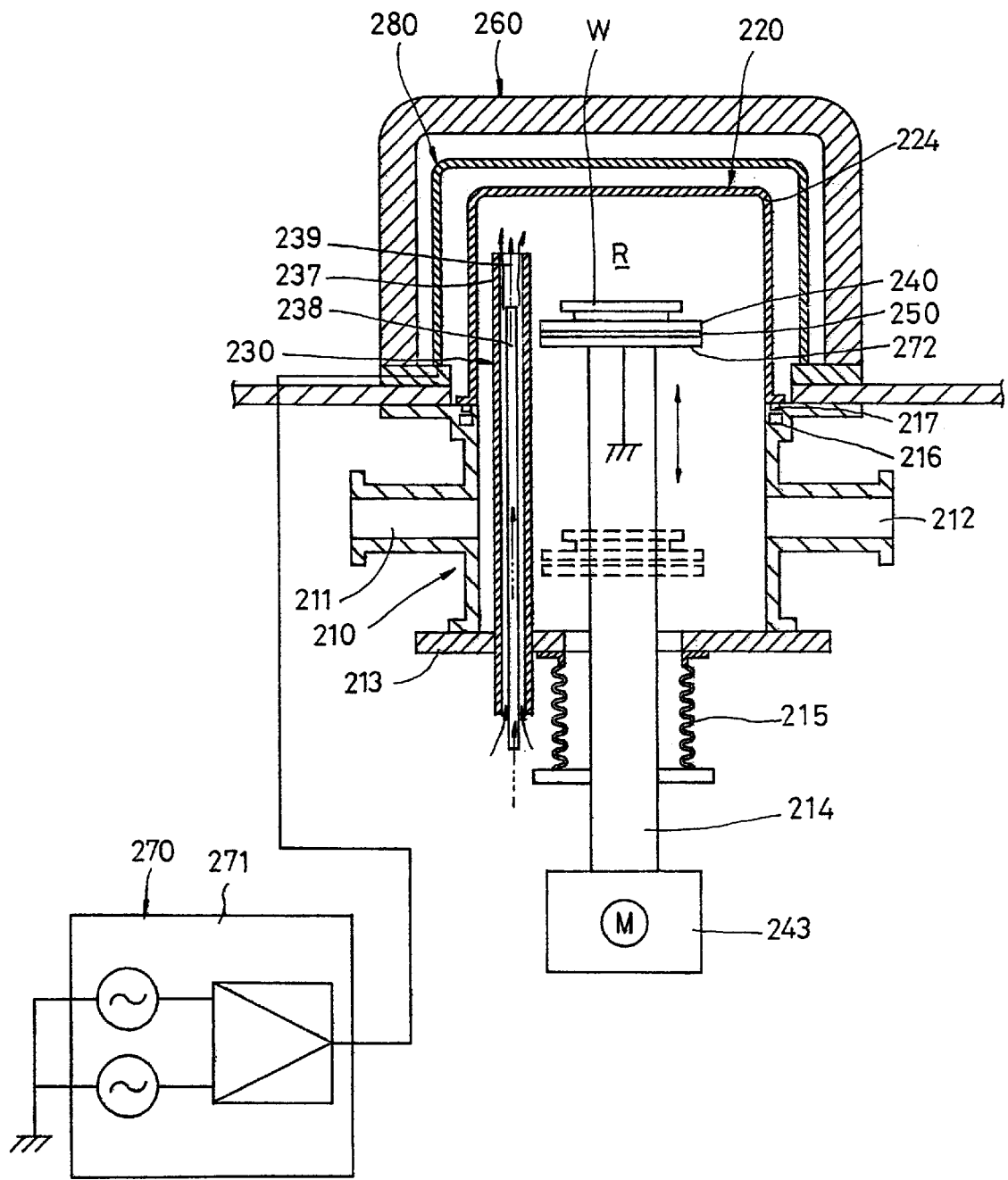
FIG. 12 is a cross-sectional view of a low pressure chemical vapor deposition apparatus of another embodiment according to the present invention.

FIG. 12 shows a lower pressure chemical vapor deposition apparatus of another embodiment of the third embodiment according the present invention, which is directed to changing the construction of the chemical source gas introducer 230.

That is, the chemical source gas introducer 230 includes an outer introduction tube 237 of which the upper portion thereof is extended to a predetermined portion higher than the deposition position of the substrate, and an inner introduction tube 238 inserted into the interior of the outer introduction tube 237 and of which the height of the upper portion thereof is similar to the deposition position of the substrate, so that various kinds of chemical source gases can be introduced through an induction path between the inner and outer introduction tubes 238 and 237 and an introduction path of the inner introduction tube 238 and can be substantially pre-heated by the heat of the reactor heating member 260, and the different chemical source gases are well mixed in a certain space 239 defined between the inner and outer introduction tubes 238 and 237 and are introduced into the reaction region "R", and thus this embodiment can achieve the same effects as the third embodiment of the present invention.

Figure 13:
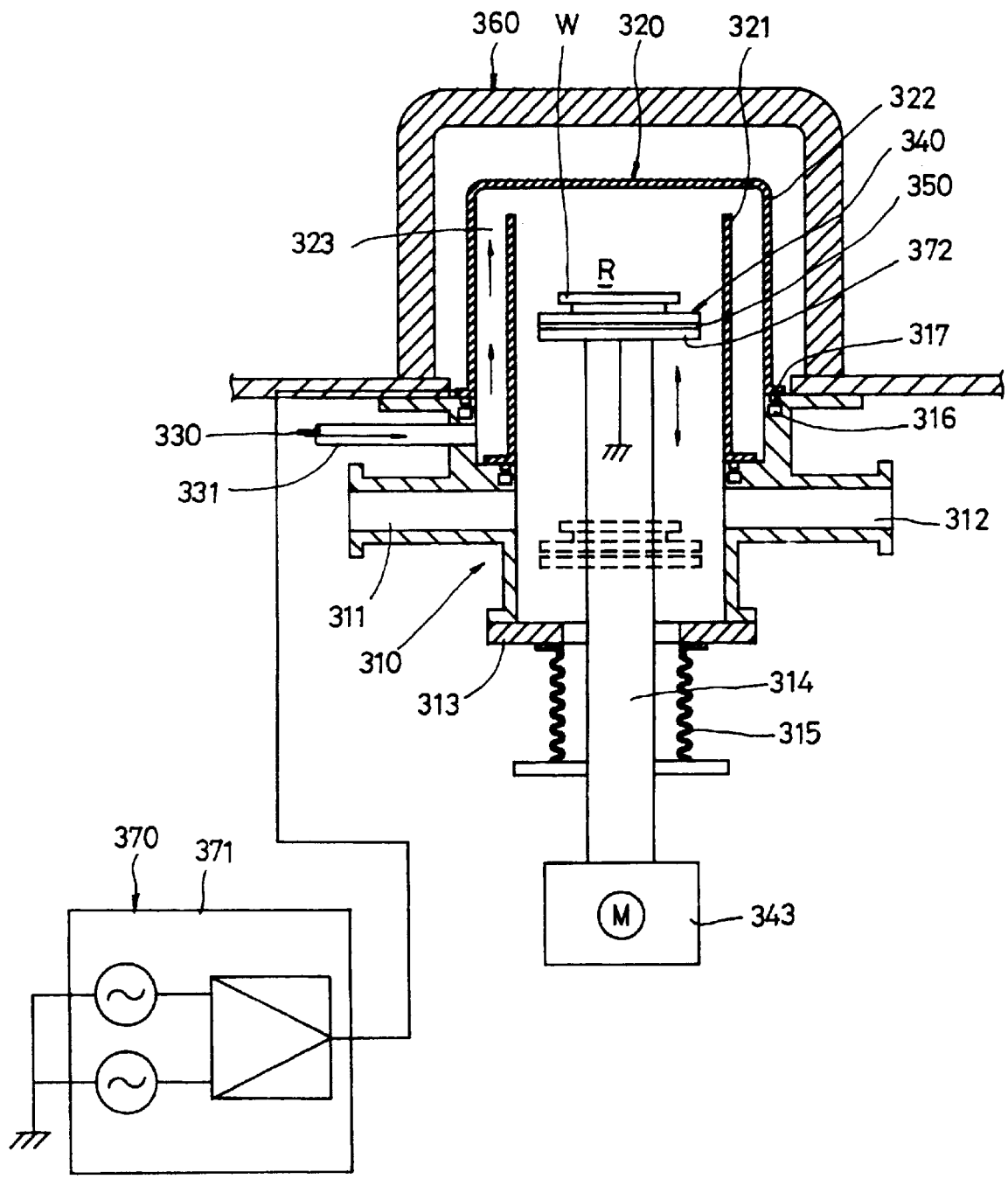
FIG. 13 is a cross-sectional view showing a low pressure chemical vapor deposition apparatus of a fourth embodiment according to the present invention.

FIG. 13 shows a lower pressure chemical vapor deposition apparatus of a fourth embodiment according to the present invention, which includes a deposition base 310 having a wafer inlet 311 for passing through the wafer "W" and an outlet 312 for exhausting reaction substances therethrough, a reactor 320 placed at the upper portion of the deposition base 310 and forming a reaction region "R" therewithin, a chemical source gas introducer 330 connected to the upper portion of the reactor for introducing the chemical source gas into the interior of the reactor 320, a substrate 340 movable within the reactor 320 from a loading/unloading position to a deposition position and on which the wafer "W" is mounted, a substrate heating member 350 for heating the wafer "W" mounted on the substrate 340, and a reactor heating member 360 disposed at a periphery of the reactor 320 for heating the reactor 320. Here, the constructions of the reactor 320 and the chemical source gas introducer 330 are different from the above-mentioned embodiment of the present invention.

That is, the reactor 320 of this embodiment mounted on the deposition base 310 includes a lower portion-opened inner tube 321, an upper portion-closed outer tube 322 wound around the upper portion and side walls of the inner tube 321, and a chemical source gas flowing path 323 formed between the side walls of the inner and outer tubes 321 and 322.

A predetermined gap connecting between the chemical source gas flowing path 323 and the reaction region "R" is formed between the upper portion of the inner tube 321 and the upper surface of the outer tube 322.

In addition, the inner tube 321 is formed with a quartz tube, and the outer tube 322 is formed with a certain material such as SiC which has a characteristic that it can indirectly heated by heat transfer or radiation heat from the reactor heating member 360. In addition, here the outer tube 322 plays the function of the electrode of the plasma generator 370.

The chemical source gas introducer 330 includes an introduction tube 331 connected to the lower portion of the chemical source gas flowing path 323.

In drawings, reference numeral 313 denotes an opening/closing plate, 314 denotes a lifting/lowering ram, 315 denotes a dust cover, 316 denotes a cooling water path, 317 denotes a packing, 343 denotes a substrate rotation member, 371 denotes a high frequency generator of a plasma generator 370, and 372 denotes an electrode disposed in the substrate 340.

The deposition process of this embodiment is the same as the second embodiment of the present invention, except that the material of the outer tube 322 of the reactor 320 has two functions of an indirect heat transfer function and an electrode function.

Figure 14:
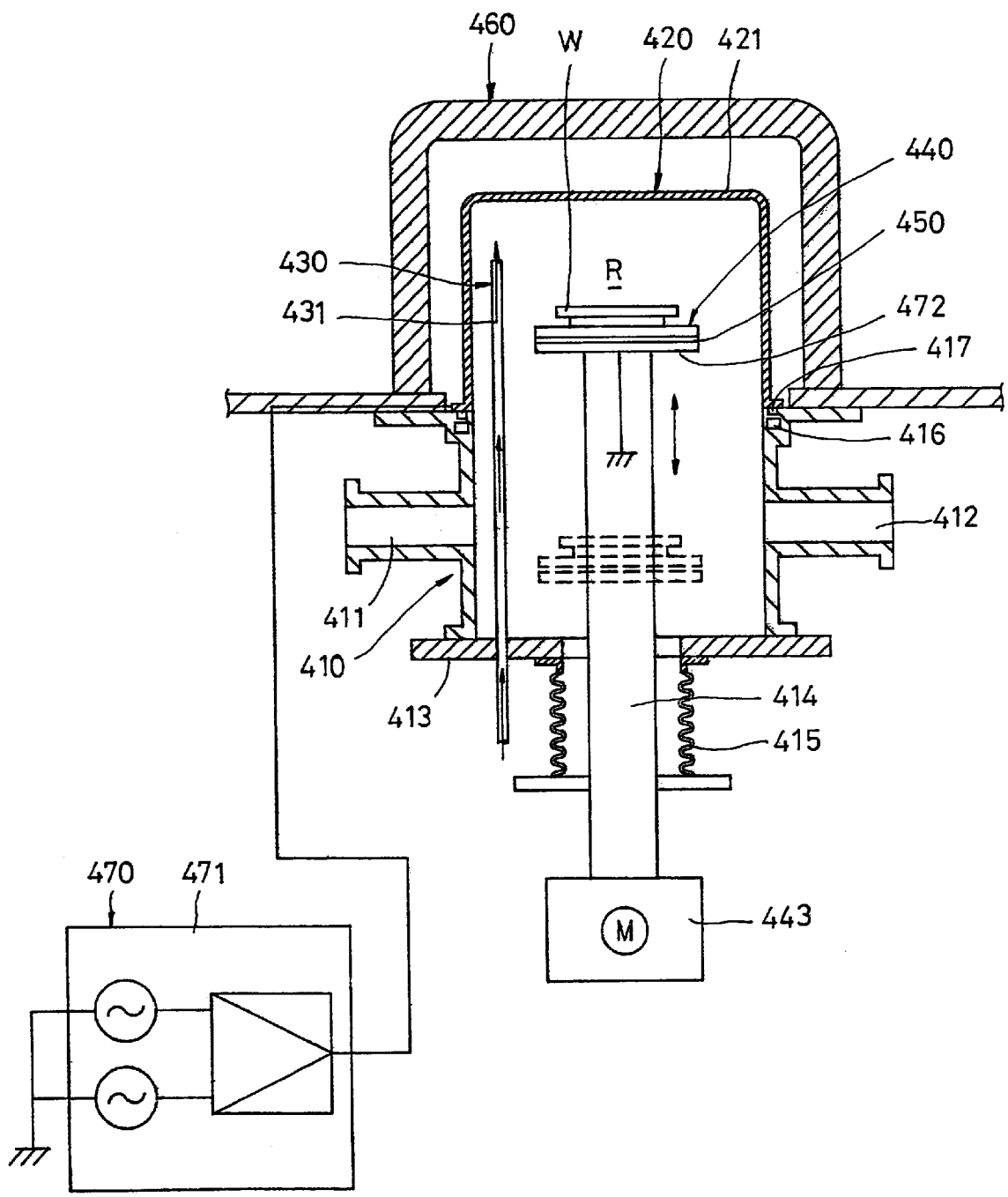
FIG. 14 is a cross-sectional view showing a low pressure chemical vapor deposition apparatus of a fifth embodiment according to the present invention.

FIG. 14 shows a low pressure chemical vapor deposition apparatus of a fifth embodiment according to the present invention, which includes an upper portion-opened and lower portion-opened deposition base 410 having a wafer inlet 411 for passing through the wafer "W" therethrough and an outlet 412 for exhausting reaction substances therethrough, a reactor 420 mounted on the deposition base 410 and having a reaction region "R" formed therein, a chemical source gas introducer 430 connected to the upper portion of the reactor 420 for introducing the chemical source gas into the interior of the reactor 420, a substrate 440 movable within the reactor 420 from a loading/unloading position to a deposition position, a substrate heating member 450 disposed in the substrate 440 for heating the wafer "W", and a reactor heating member 460 disposed at a periphery of the reactor 420 for heating the reactor. The construction of this embodiment is similar to the fourth embodiment except the constructions of the reactor 420 and the chemical source gas introducer 430.

That is, the reactor 420 includes a lower portion-opened and upper portion-closed tube 421, which is formed with SiC. Here the SiC tube 421 plays an indirect heat transfer function and a plasma generating function including its basic function of providing a reaction region "R".

In addition, the chemical source gas introducer 430 includes an introduction tube 431 vertically passing through the opening/closing plate 413 of the deposition base 410 and having the upper portion extended to a predetermined portion higher than the substrate.

In FIG. 14, reference numeral 413 denotes an opening/closing plate, 414 denotes a lifting/lowering ram, 415 denotes a dust cover, 416 denotes a cooling water path, 417 denotes a packing, 413 denotes a substrate rotation member, 471 denotes a high frequency generator of the plasma generator 470, and 472 denotes an electrode of the substrate 440.

The deposition process including an introduction process of introducing the chemical source gas of this embodiment is the same as the previous embodiment except that the reaction path 420 is formed with single tube 421. That is, this embodiment includes the single tube 421 having an indirect heat transfer and the electrode function. In more detail, the indirect heat transfer and electrode member is not necessary.

Figure 15:
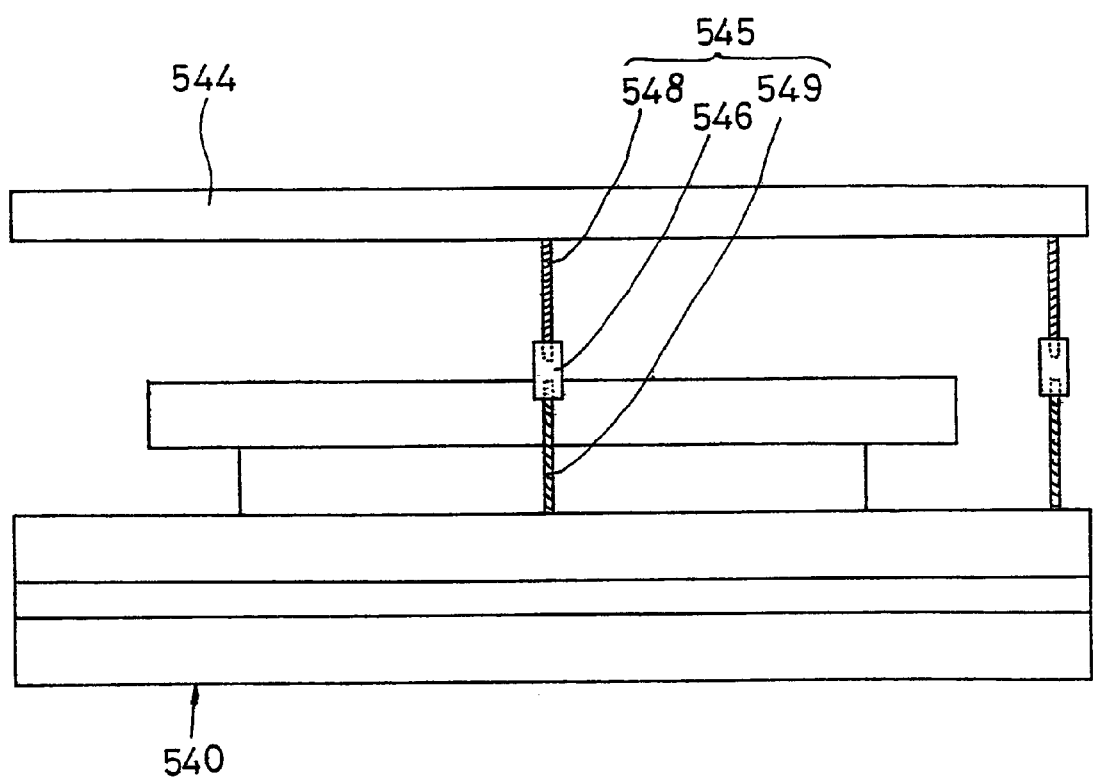
FIG. 15 is a partial enlarged cross-sectional view showing a substrate of an embodiment adopted in the present invention.

FIG. 15 shows a substrate of another embodiment according to the present invention. That is, the substrate 540 includes a chemical source gas dispersion plate 544 for evenly introducing the chemical source gas over the entire surface of the wafer "W" mounted on the substrate 540.

The substrate 540 and the dispersion plate 540 are engaged by a gap control member 545 for controlling the gap therebetween.

The gap control member 545 includes threaded bars 547 and 548 connected to the substrate 540 and the dispersion plate 544 and a turn buckle-type control knob 546 engaged to the threaded bars 547 and 548. The threaded bars 547 and 548 includes each three threaded bars and is disposed so as to prevent any interference from the wafer "W" which loaded/unloaded through the wafer inlet 511.

The substrate 540 is directed to evenly introducing the chemical source gas over the entire surface of the wafer "W" by preventing the chemical source gas from being directly introduced onto the surface of the wafer "W" in a process that the chemical source gas is introduced into the reaction region "R" and from unevenly and partially introducing onto the surface of the wafer "W" by allowing the chemical source gas to cover the surface of the wafer "W" through the gap formed between the wafer "W" on the substrate 540 and the dispersion plate 544, so that even thickness of a thin film can be achieved.

In addition, a desired thin film can be achieved by controlling the gap between the upper surface of the substrate 540 and the dispersion plate 544 in accordance with the conditions of the chemical source gas and the thin film.

The above-mentioned construction is not limited to its range of use. If possible, the construction can be used for any embodiments having a construction for controlling the gap therebetween.

Figure 16:
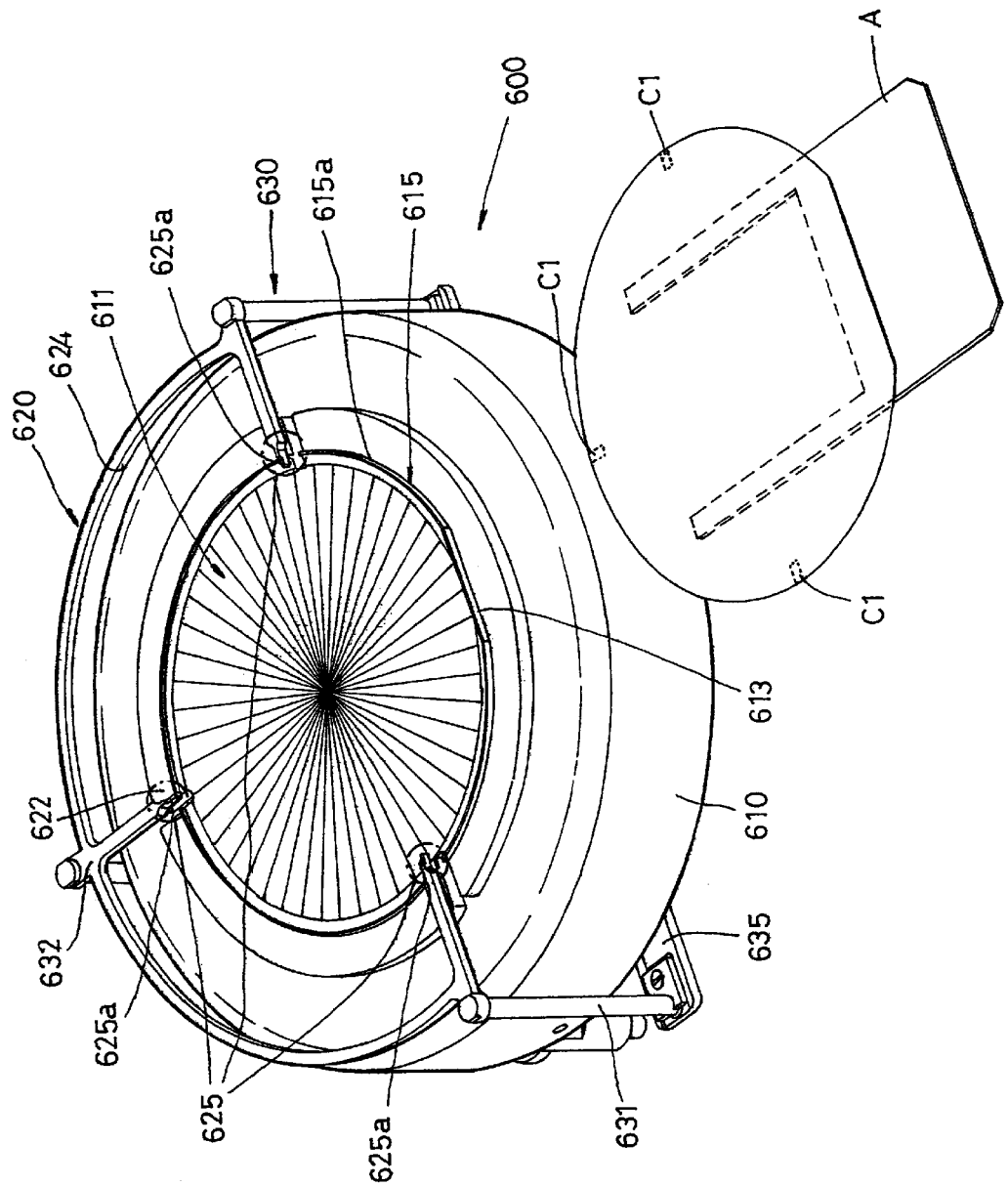
FIG. 16 is an enlarged perspective view showing a substrate of another embodiment adopted in the present invention.

FIG. 16 shows a substrate of another embodiment adopted in the low pressure chemical vapor deposition apparatus of the present invention, which is directed to achieving a desired loading/unloading operation using a robot hand "A" and receiving the entire surface of the wafer "W".

That is, the substrate 600 includes a substrate body 610 having a placement section 611 for substantially receiving the wafer "W" except the part of the circular portion C1 thereof and a wafer holder 620 having an assistant placement section 625 for receiving the remaining circular part of the wafer "W".

A circular protrusion 615*a* contacting with the outer circumferential surface of the circular section C1 of the wafer "W" are formed on the circular section 615 of the placement section 611.

The length of the straight line section 613 is the same as the length of the flat zone "F" of the wafer "W".

The circular protrusions 615*a* and 616*a* are protruded by preferably about 0.8 mm which is thickness of the wafer "W".

The wafer holder 620 is formed to be U-shaped by a connection circular section 624 formed between the both sides straight line section 623 and the straight line sections 622 and 625.

The outer diameter of the wafer holder 620 is the same as the outer diameter of the substrate body 610, and the width of the cut-away groove is wider than that of the robot hand "A".

An assistant placement section 625 is formed at the both sides straight line section 625, on which the both sides circular section C1 of the wafer "W" is mounted.

A circular protrusion, in which the outer circumferential surface of the both sides circular section C1 contacts with the inner surface thereof, is formed at a periphery of the assistant placement section 625*a*. The circular protrusion is protruded by about 0.8 mm which is similar to the thickness of the wafer "W".

In addition, the holder lifting/lowering bar 630 is provided so as to lifting/lowering the wafer holder 620.

The holder lifting/lowering bar 630 includes a plurality of connection bars 631 (preferably three bars) of which the upper end is connected to the outer end of the wafer holder 620, and a lifting/lowering connection bar 534 for fixing the lower ends of the connection bars 631, so that the lifting/lowering connection bars 634 are lifted/lowered by a lifting/lowering member (not shown).

A plurality of connection plates 632 and 635, which has the same number as the connection bars), are protruded from the outer end of the wafer holder 620, so that the wafer holder 620 and the lifting/lowering bars 634 are integrally connected by fixing the higher and lower ends of the connection bars 631 to the connection plates 632 and 635 using fixing screws 633 and 636.

Here, since the connection bars 631 are disposed at the rear portion and at both sides of the wafer holder 620, there is not any interference between the connection bars 631 and the wafer "W" while the wafer "W" is loaded or unloaded.

A ram aperture 637, through which the lifting/lowering ram passes through for lifting/lowering the substrate, is formed at the central portion of the lifting/lowering connection bar 634, so that there is not any interference between the lifting/lowering ram and the holder lifting/lowering bar 630.

A screw aperture 638 for engaging the lifting/lowering drive member is formed at a periphery of the ram aperture 637 of the lifting/lowering connection bar 634.

The lifting/lowering drive member is not limited to its range of use of hydrogen cylinder, pneumatic cylinder, step motor, or linearly lifting/lowering drive device using motorized-screw.

The operation of loading/unloading the wafer "W" on/from the substrate 600 of this embodiment according to the present invention will now be explained.

To begin with, as shown in FIGS. 16 through 18A through 18D, the wafer "W" is moved immediately above the wafer holder 620 by lifting the holder lifting/lowering bars 630 by the lifting/lowering drive member in a state that the lower surface of the wafer holder 620 is spaced apart from the upper surface of the substrate 610.

Figure 18A:
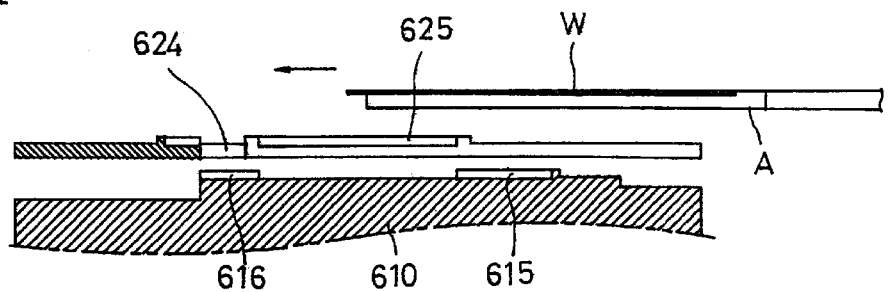
FIGS. 18A through 18D are views showing an operation of a substrate adopted in the present invention.
Figure 18B:
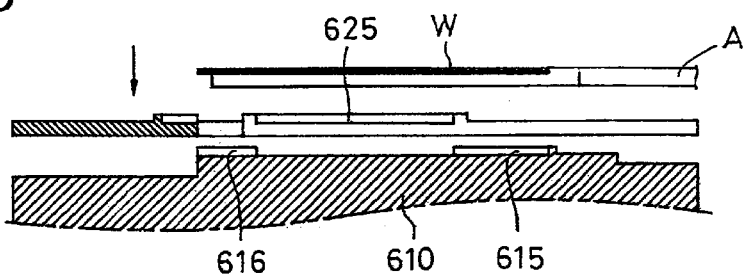
Figure 18C:
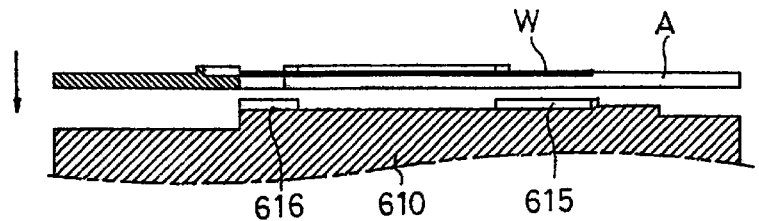

Referring to FIG. 18B, the flat zone "F" of the wafer "W" is mated with the straight line section of the substrate straight section 613, and the both sides circular section C1 of the wafer "W" is mated with the both sides assistant placement section 625*a* of the wafer holder 620, and as shown in FIG. 18C, the robot hand "A" is lowered and places the wafer "W" on the assistant placement section 625*a* of the wafer holder 620.

At this time, since the width of the robot hand "A" is narrower than the inner width of the cut-away groove 621 of the wafer holder 620, there is not any interference between the robot hand "A" and the wafer holder 620.

The wafer "W" on the wafer holder 620 is placed on the assistant placement section 625*a*, and the outer ends of the both sides circular section C1 comes into contact with the circular protrusions 625*a*.

Next, when the robot hand "A" comes off from the wafer holder 620, only the wafer "W" is placed on the holder 620.

Figure 18D:
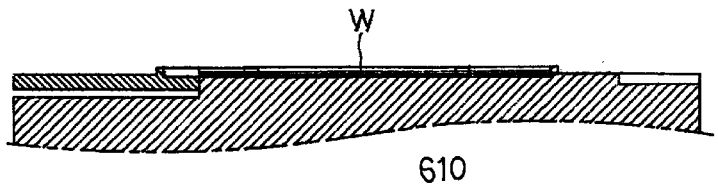
Figure 19:
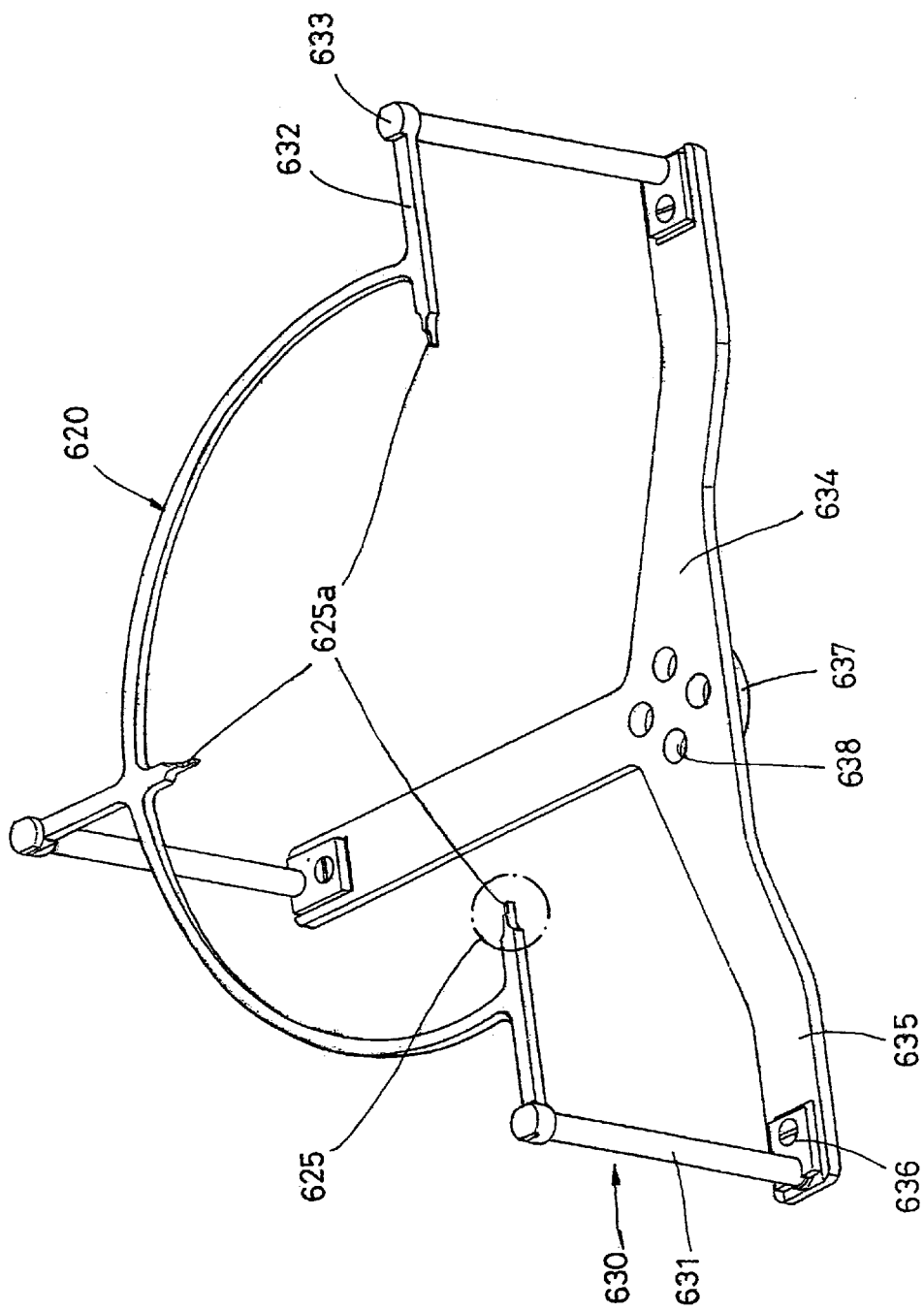
FIG. 19 is a partial perspective view showing a substrate of further another embodiment adopted in the present invention.

When the robot hand "A" comes off from the wafer holder 620, the wafer holder 620 is lowered in accordance with a lowering of the holder lifting/lowering bar 630 which is lowered by the lifting/lowering drive member, so that as shown in FIG. 18D, the wafer is placed on the placement section 611.

When using the above-mentioned substrate 600, the heat from the substrate heating member disposed in the substrate body 610 is directly transferred to the region of the placement surface 612 of the placement section 611, and the heat therefrom is transferred to the region of the assistant placement section 625*a* of the wafer holder 620 through the wafer holder 620, so that the heat is evenly transferred to the entire surface of the wafer "W".

Therefore, since the wafer "W" is tightly placed on the substrate 600, the deposition is evenly conducted over the entire surface of the wafer "W", so that better thin film without particle and cracks can be achieved, and a desired uniformity of the thin film can be also achieved, and the heat loss can be advantageously prevented.

In addition, since a thin lifting/lowering pin is not used as the conventional art, it is possible to prevent breakages of parts, and the maintenance is easier compared with the prior art.

Moreover, in a state that the outer end of the circular section C1 of the wafer "W" contact with the placement section and the inner surface of the circular protrusions 615a and 625a formed on the wafer holder 620, since the wafer "W" is placed, the heat efficiency can be increased.

Figure 17:
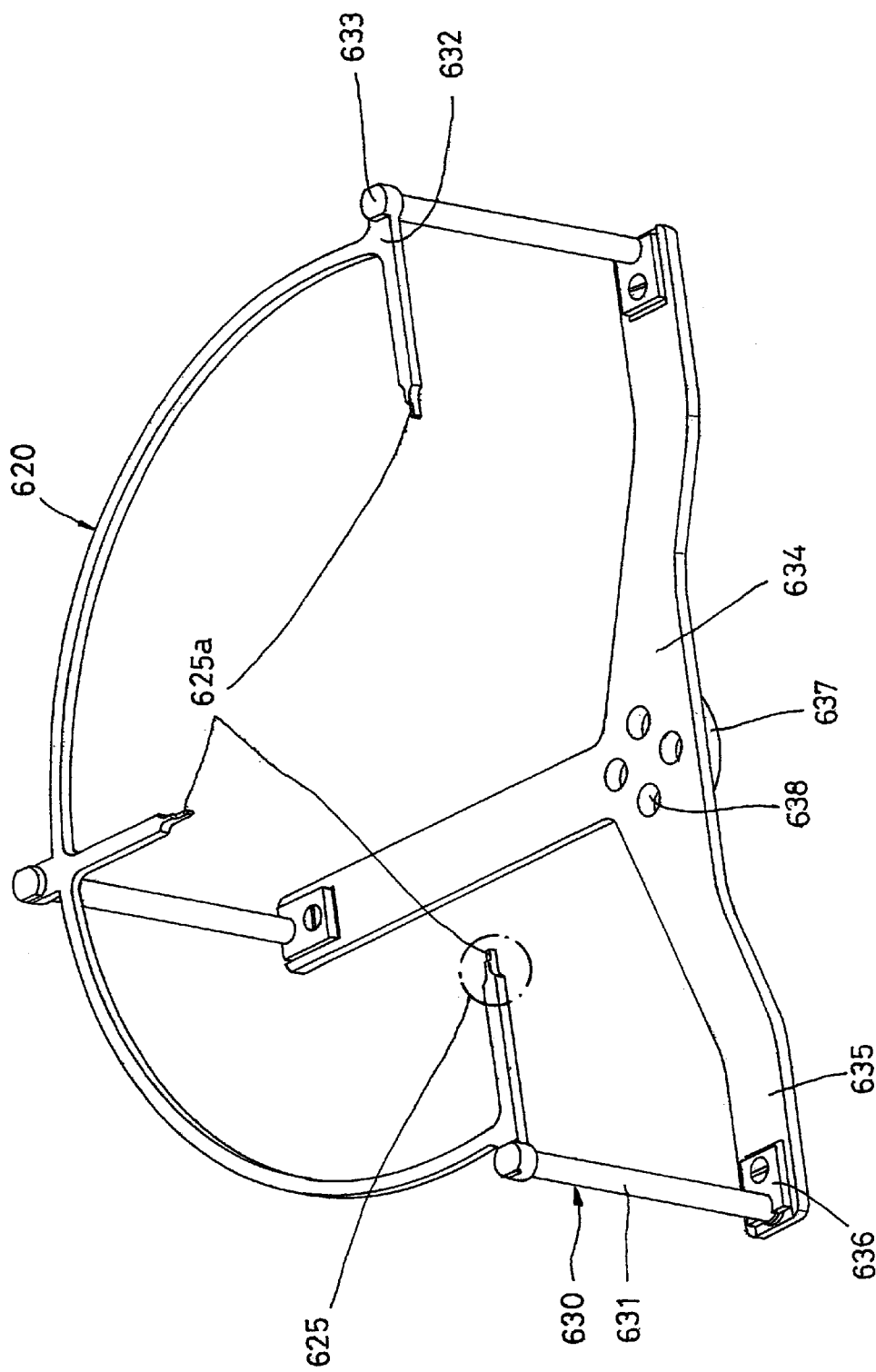
FIG. 17 is a partial disassembled perspective view showing a substrate of FIG. 16 according to the present invention.

FIG. 17 shows a substrate of another embodiment according to the present invention, which is directed to controlling heat transfer efficiency with respect to the wafer "W" in accordance with a kind of thin film to be deposited by providing a wafer holder 602 having an outer diameter smaller than the outer diameter of the substrate body 610.

In addition, the length of the connection plate 632 connected with the connection bar 631 is longer than that in the previous embodiment since the outer diameter of the wafer holder 620 is smaller than that of the substrate body 610.

Since the remaining constructions are the same as the embodiment of FIG. 16 through FIGS. 18A through 18D, the description with respect thereto will be omitted.

The above-mentioned aspect can be adopted to all the embodiments of the present invention.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. An apparatus for a low pressure chemical vapor deposition, comprising:
   a supporting base;
   a reactor disposed on said supporting base, said reactor including an upper portion-opened and lower portion-opened inner tube and
   a lower portion-opened and upper portion-closed outer tube winding around said inner tube, wherein a chemical source gas flowing path is formed between an inner wall of said inner and outer tubes and an upper portion thereof, and a chemical source gas introducer is a gas introducing tube connected to a lower end of said chemical source gas flowing path;
   a substrate being movable between a loading/unloading position and a deposition position within said reactor for receiving a wafer thereon;
   substrate heating means disposed in said substrate for heating said wafer; and
   reactor heating means for heating the reactor.

2. The apparatus of claim 1, wherein said reactor heating means is disposed at the upper portion and the inner wall of the outer tube, and a heat transfer member and an electrode member is disposed between the outer tube and a reactor heating member.

3. The apparatus of claim 1, wherein said substrate includes an electrode, said electrode of said substrate and said heat transfer member and said electrode member having a plasma generating means having a high frequency generator.

4. An apparatus for a low pressure chemical vapor deposition, comprising:
   a supporting base;
   a reactor disposed on said supporting base, said reactor including an upper portion-opened and lower portion-opened inner tube and
   a lower portion-opened and upper portion-closed outer tube winding around said inner tube having a heating and an electrode function,
   wherein a chemical source gas flowing path is formed between an inner wall of said inner and outer tubes and an upper portion thereof, and a chemical source gas introducer is connected to a lower end of said chemical source gas flowing path;
   a substrate being movable between a loading/unloading position and a deposition position within said reactor for receiving a wafer thereon;
   substrate heating means disposed in said substrate for heating said wafer; and
   reactor heating means for heating the reactor.

5. The apparatus of claim 4, wherein said reactor heating means is disposed between the upper portion of the outer tube and the inner wall.

6. The apparatus of claim 4, wherein said substrate includes an electrode, said electrode and said reactor having a plasma generating means having a high frequency generator.

* * * * *